US008476905B2

(12) United States Patent
Tanaka et al.

(10) Patent No.: US 8,476,905 B2
(45) Date of Patent: Jul. 2, 2013

(54) SIGNAL TRANSMITTING AND RECEIVING CIRCUIT, A NMR PROBE, AND A NUCLEAR MAGNETIC RESONANCE EQUIPMENT

(75) Inventors: Hideki Tanaka, Hitachinaka (JP); Manabu Hasegawa, Hitachi (JP); Tsuyoshi Wakuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 755 days.

(21) Appl. No.: 12/635,451

(22) Filed: Dec. 10, 2009

(65) Prior Publication Data

US 2010/0156423 A1    Jun. 24, 2010

(30) Foreign Application Priority Data

Dec. 11, 2008  (JP) .................................. 2008-315496
Mar. 11, 2009  (JP) .................................. 2009-057840

(51) Int. Cl.
    *G01V 3/00*        (2006.01)
(52) U.S. Cl.
    USPC ........................................ 324/322; 324/318
(58) Field of Classification Search
    USPC .................. 324/322, 318, 319, 314
    See application file for complete search history.

(56) References Cited

U.S. PATENT DOCUMENTS

| | | | | |
|---|---|---|---|---|
| 4,739,271 | A | * | 4/1988 | Haase ............................ 324/322 |
| 4,901,022 | A | * | 2/1990 | Keren et al. .................... 324/322 |
| 5,054,114 | A | * | 10/1991 | Erickson ........................ 455/78 |
| 7,388,377 | B2 | | 6/2008 | Alvarez et al. |
| 7,560,932 | B2 | | 7/2009 | Fukuda et al. |

FOREIGN PATENT DOCUMENTS

| | | | |
|---|---|---|---|
| JP | 61-196144 | A | 8/1986 |
| JP | 63-58241 | A | 3/1988 |
| JP | 8-252237 | A | 10/1996 |
| JP | 2006-149518 | A | 6/2006 |
| JP | 2007-322361 | A | 12/2007 |
| JP | 2008-35987 | A | 2/2008 |
| JP | 2008-89498 | A | 4/2008 |
| JP | 2008-128943 | A | 6/2008 |
| JP | 2008-209292 | A | 9/2008 |
| JP | 2008-241493 | A | 10/2008 |

OTHER PUBLICATIONS

Japanese Office Action dated Mar. 8, 2011 (Japanese language).
Japanese Office Action dated Aug. 21, 2012 (three (3) pages).
Japanese Office Action dated Apr. 23, 2013 ((3) pages).

* cited by examiner

Primary Examiner — Louis Arana
(74) Attorney, Agent, or Firm — Crowell & Moring LLP

(57) ABSTRACT

An object of the invention is to change over accurately the switch part between use condition and nonuse condition. A signal transmitting and receiving circuit 100 for transmitting and receiving signals comprises a tuning and matching circuit 3 for transmitting and receiving the signals, a signal communication wire 4 transmitting the signals, and a wavelength wire 11 having a length (L) defined by a relational expression given in an Equation of $L=N \cdot (\lambda/4)$ where L: length of the wavelength wire, N: 1, 2, 3, . . . , and $\lambda$: wavelength. The circuit 100 also comprises a switch part 12 changing over between a grounded connection target and an ungrounded connection target. Further, the tuning and matching circuit 100 is mutually connected to the signal communication wire 11, and the wavelength wire 11 is constituted such that one end thereof is connected between the tuning and matching circuit 3 and the signal communication wire 4, and the other end thereof is connected to the switch part 12.

19 Claims, 14 Drawing Sheets

The receiving circuit at the time of transmitting signals

The transmitting circuit at the time of transmitting signals

The receiving circuit at the time of receiving signals

The transmitting circuit at the time of receiving signals

SIGNAL TRANSMITTING AND RECEIVING CIRCUIT, A NMR PROBE, AND A NUCLEAR MAGNETIC RESONANCE EQUIPMENT

FIELD OF THE INVENTION

The present invention relates to a signal transmitting and receiving circuit, a signal transmitting and receiving equipment, a nuclear magnetic resonance (hereinafter referred to as a NMR) probe, and a NMR equipment.

BACKGROUND OF THE INVENTION

A separated coil between the transmitting side and the receiving side (transmitting and receiving separated coil, hereinafter referred to as a separated coil) is often used as an inspection coil of NMR signal.

Such transmitting and receiving separated coils have been electrically and magnetically combined or coupled. The matching with a resonance circuit connecting between the transmitting side coils and the receiving side coils may be difficult. There may be leaks of magnetic field from the transmitting side coils to the receiving side coils at the time of irradiation of magnetic field intensity as being a transmitting signal. In such a case, a preamplifier connected to the receiving coils may be saturated by the irradiated magnetic field intensity. Then, the preamplifier may result in a condition impossible for being temporarily or permanently used.

It is necessary to degrade the above combination or coupling in the transmitting and receiving separated coils in order to solve the above problems.

Various technical arts described in U.S. Pat. No. 7,388,377 B2 has been known as a technical art to degrade the combination or coupling of the above transmitting and receiving separated coils. In the above Publication, the spectroscopic transmitting and receiving coils of NMR (hereinafter referred to as a NMR probe) for switching between the transmitting and receiving conditions of RF with use of a diode switch as a switch part has been disclosed. This technical art is designed to arrange a diode switch in a tuning and matching circuit resonating RF antenna coil at a specific frequency, and is a circuit for changing a resonance condition.

The NMR probe is required to be arranged in the strong magnetic field intensity. However, when magnetic field intensity goes beyond the prescribed intensity or the temperature goes beyond the prescribed temperature range, the phenomena to degrade the quality of a diode switch as a switch part have been already known. In the technical art described in the above publication, a diode switch for switching between the transmitting and receiving conditions of RF transmitting and receiving circuit is arranged inside or near the tuning and matching circuit in the strong magnetic field. For this reason, the tuning and matching circuit becomes large, when the diode switch is arranged to be far away in the magnetic field to be accurately operated. That is, it is problems to become too long in a circuit length of the tuning and matching circuit and deteriorate the quality factor (Q value) of the tuning and matching circuit.

Considering the above, an object of the present invention is to easily switch ON or OFF of the tuning and matching at the time of use or nonuse.

SUMMARY OF THE INVENTION

To solve the above problems, a means of the present invention is characterized in that a signal transmitting and receiving circuit for transmitting and receiving signals includes a tuning and matching circuit for transmitting and receiving the signals, a signal communication wire for transmitting the signals, a wavelength wire having a length (L) defined by an equation, as being $L = N \cdot \lambda/4$ where $N = 1, 2, 3, \ldots$, when the wavelength of the signal is $\lambda$, and a switch part for changing over between a grounded connection target and an ungrounded connection target. Then, the tuning and matching circuit is mutually connected to the signal communication wire. The wavelength wire is constituted such that one end thereof is connected between the tuning and matching circuit and the signal communication wire, and the other end thereof is connected to the switch part.

The other means of the present invention is characterized in that the signal transmitting and receiving circuit includes a tuning and matching circuit for transmitting and receiving the signals, a first capacitor provided in the tuning and matching circuit, one end thereof connecting to ground, a signal communication wire transmitting the signals, a wavelength wire having a length (L) defined by a relational expression given in an equation, as being $L = N \cdot \lambda/4$ where $N = 1, 2, 3, \ldots$, when the wavelength of the signal is, a switch part changing over between a grounded connection target and an ungrounded connection target. Then, the tuning and matching circuit is mutually connected to the signal communication wire, and the wavelength wire is constituted such that one end thereof is connected to a ungrounded side of the first capacitor and the other end thereof is connected to the switch part. Further, the tuning and matching circuit is designed such that whether an impedance including a capacity value of the first capacitor is set to tune and match to the signals, or an impedance not including a capacity value of the first capacitor is set to tune and match to the signals.

The other means for the solution will be appropriately described in the following embodiments.

According to the present invention, the switch part can be accurately changed over, changing over between the case in use or in nonuse.

BRIEF DESCRIPTION OF THE INVENTION

DETAILED DESCRIPTION OF THE INVENTION

Next, an embodiment for carrying out the invention (hereinafter referred to as an embodiment) will be described in details with reference to drawings. In these embodiments, the description of the common element will be omitted by using the same sign as the same constituent.

First Embodiment

Figure 1:
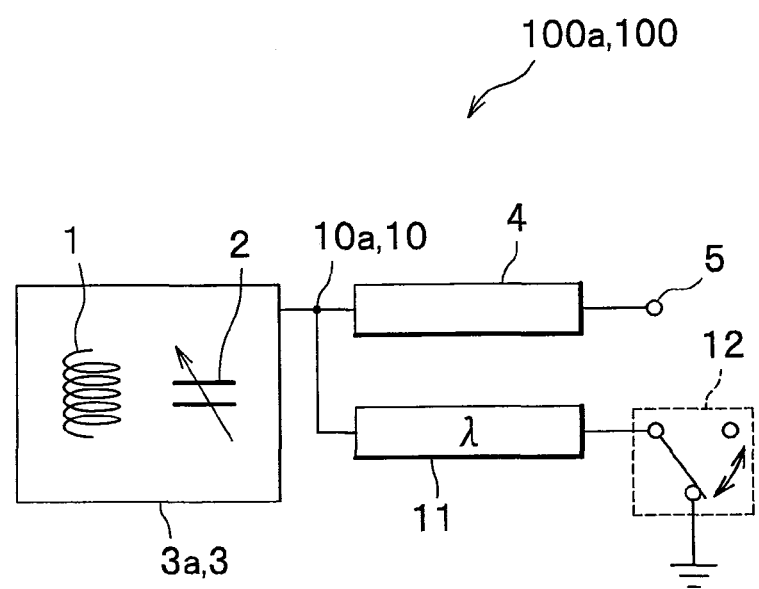
FIG. 1 is a schematic view of a RF transmitting and receiving circuit relating to a first embodiment.

FIG. 1 is a schematic view of a RF transmitting and receiving circuit relating to a first embodiment.

A RF transmitting and receiving circuit 100a (100) (signal transmitting and receiving circuit) comprises a tuning and matching circuit 3a, 3 irradiating RF magnetic field (transmitting signal) to a sample and receiving an electromagnetic signal of NMR (receiving signal) excited in the sample, and a signal communication wire 4 in which one is connected to the tuning and matching circuit 3a and the other is connected to RF terminal 5. The transmitting and receiving signal is appropriately described as a RF signal, as the transmitting and receiving signal used for a NMR measurement is mostly a RF signal as being 10 MHz or more. The signal communication wire 4 is a line for communicating transmitting signals or receiving signals. The tuning and matching circuit 3a including a RF coil 1 resonates a RF coil 1 in the prescribed resonance frequency to transmit and receive the RF signal between the RF coil 1 and an outside circuit through the signal communication wire 4. Although the tuning and matching circuit 3a is a circuit composed of a combination of the RF coil 1 and a trimming capacitor 2, a constitution of the tuning and matching circuit 3a is not illustrated in FIG. 1, as a combination of the RF coil 1 and the trimming capacitor 2 can be freely selected and is not limited in particular. A constitutional example of the tuning and matching circuit 3a will be later described in FIG. 2 or 3.

The RF transmitting and receiving circuit 100a has a junction 10a (10) between the tuning and matching circuit 3a and the signal communication wire 4. It has a wavelength wire 11 in which one end thereof is connected to the junction 10a and the other end thereof is connected to a switch part 12. The switch part 12 connected to the wavelength wire 11 is constituted such that one end thereof is connected to ground and the other end thereof is not connected to ground. Although a diode 13 (Referring to FIG. 2) is preferable as the switch part 12, a superconductor or a mechanical switch may be used as the switch part 12.

Although the RF transmitting and receiving circuit 100a relating to this embodiment may be used as the transmitting and receiving circuit of low frequency signal, it is preferable to use as the transmitting and receiving circuit of RF signal as being 10 MHz or more.

The RF coil 1 is designed to tune in and match an impedance to be the specific resonance frequency by means such as the trimming capacitor 2. The RF signal transmitted from the tuning and matching circuit 3a is transmitted from an outside circuit, as not shown, connecting to a RF terminal 17 (5) (Referring to FIG. 2) through the signal communication wire 4 to the tuning and matching circuit 3a. As well, the RF signal received by the tuning and matching circuit 3a is transmitted through the signal communication wire 4 to the outside circuit, as not shown, connecting to the RF terminal 19 (5) (Referring to FIG. 3).

A length of the wavelength wire 11 is regulated to a length as the switch part 12 being not influenced by the strong magnetic field in an area where the RF transmitting and receiving circuit 100a is installed. The length L is regulated in accordance with the following expression (1). In addition, $\lambda$ is a wavelength of RF signal in the following expression (1).

$$L = N \cdot \lambda/4 \qquad (1)$$

where, $N = 1, 2, 3, \ldots$.

Hereinafter, a function of the wavelength wire 11 will be described.

At first, it will be described in case of an odd number in N of the equation (1).

The wavelength wire 11 is designed such that in case of zero in voltage magnitude of one end thereof, the voltage magnitude of the other end thereof becomes a maximal value in reference to a signal of the $\lambda$ in wavelength or a signal of the number multiplied by odd times in wavelength. In reverse, when the voltage magnitude at one end thereof is a maximal value, the voltage magnitude at the other end thereof becomes zero.

When one end in the side of the switch part 12 of the wavelength wire 11 is not connected to ground, the voltage magnitude at this end becomes a maximal value. Then, the voltage magnitude of the other end in the opposite side, that is, the junction 10a becomes zero. This means the junction to be equal to GND, and the signal of $\lambda$ in wavelength and the signal multiplied by odd times of $\lambda$ in wavelength is not able to pass through the junction 10a. Therefore, the junction 10a in this situation is described to actuate as BEF (Band Eliminated Filter) in this embodiment.

On the other hand, in case where one end in the switch part 12 of the wavelength wire 11 is connected to ground, voltage amplitude at this one end becomes zero, and the voltage amplitude in the opposite end, that is, the junction 10a becomes to be a maximal value. This means the wavelength wire 11 not to be connected to the junction 10a, and the signal of $\lambda$ in wavelength or the signal multiplied by odd times in wavelength is able to pass the junction 10a. Therefore, the junction 10a in this situation is described to actuate as BPF (Band Pass Filter) in this embodiment.

Next, it will be described in case of an even number in N of the equation (1). In this case, the wavelength 11 is designed such that in case of zero in voltage magnitude of one end thereof, the voltage magnitude of the other end thereof becomes zero in reference to a signal of $\lambda$ in wavelength or a signal of the number multiplied by odd times in wavelength. In reverse, when the voltage magnitude at one end thereof is a maximal value, the voltage magnitude at the other end thereof becomes a maximal value. Thus, as well as the above case of an odd number in N, it may be operated as BPF or as BEF by changing over the junction 10a between the grounded condition and the ungrounded condition of the switch part 12.

In this way, it may be operated as BPF or as BEF by changing over the junction 10a between the grounded condition and the ungrounded condition of the switch part 12.

Hereinafter, it will be described about the case of an odd number in N concerning the first embodiment to be a simple explanation. The description about the grounded condition and the ungrounded condition of the switch part 12 as shown the following is an example, and a method for use is not limited thereto. As above mentioned, it is essential to change over the junction 10a between the grounded condition and the ungrounded condition of the switch part 12 to operate as BPF or as BEF in the RF transmitting and receiving circuit 100a relating to this embodiment.

As described later, the RF transmitting and receiving equipment is divided into the transmitting side circuit as being the transmission dedicated circuit and the receiving side circuit as being the receiving dedicated circuit in this embodiment, and to be equipped with the RF transmitting and receiving circuit 100a in the transmitting side circuit and the receiving side circuit.

In this constitution, the RF transmitting and receiving circuit 100a has a common constitution in the transmitting side circuit and the receiving side circuit. A timing at the time of use is, however, different between the transmitting side circuit and the receiving side circuit. In case of using as the transmitting side circuit, it is supposed to be a condition in use at the time of transmitting, and to be a condition in nonuse at the time of receiving. In case of using as the receiving side circuit, it becomes inverse to be a condition in nonuse at the time of transmitting and a condition in use at the time of receiving.

This changeover is switched by changing over the switch part 12. When the RF transmitting and receiving circuit 100a is in a condition in use, the switch part 12 is changed over to connect to ground such that the junction 10a is actuated as the BPF. On the other hand, when it is in a condition in nonuse, the switch part 12 is changed over not to connect to ground such that the junction 10a is actuated as the BEF.

In case of changing the trimming capacitor 2 of the tuning and matching circuit 3a and matching the tuning and matching, it remains to be a condition to actuate the junction 10a as BPF.

As above mentioned, as the resonance frequency in the tuning and matching circuit of the transmitting side circuit and the receiving side circuit is almost the same, the transmitting signal and the receiving signal leak in the other and exhaust in the tuning and matching circuit 3a, the signal communication wire 4, and the like. Then, the loss of the transmitting signal and the receiving signal becomes too large.

Accordingly, in order to prevent from the loss of the transmitting side circuit at the time of receiving, the loss generating at least in the signal communication wire 4 can be prevented by operating the junction 10a as BEF at the time of receiving signals. Thus, the loss generating in the transmitting side circuit at the time of receiving signals can be prevented.

The switch part 12 may be changed over to the ungrounded side in order to operate the junction 10a of the tuning and matching circuit 3a and the signal communication wire 4 as BEF.

The transmitting side circuit becomes equivalent to the circuit, in which the wavelength wire 11 is not connected to the tuning and matching circuit 3a based on the above reason by operating the junction 10a as BPF at the time of transmitting signals. The quality factor (Q value) of the transmitting circuit maintains to be almost the same value in the circuit before the wavelength wire 11 is connected.

In case of preventing from losses in the receiving side circuit at the time of transmitting signals, it may be also the same constitution by changing the transmitting side to the receiving side.

In order to connect one end of the wavelength wire 11 to ground, the circuit including the diode 13 (referring to FIGS. 2 and 3) is connected, for example, to one end of the wavelength line 11, then to send control signals to the diode 13.

As the wavelength wire 11 is connected to the junction 10a positioned between the tuning and matching circuit 3a and the signal communication wire 4, it can prevent from the loss in the signal communication wire 4 at the time of nonuse.

Figure 2:
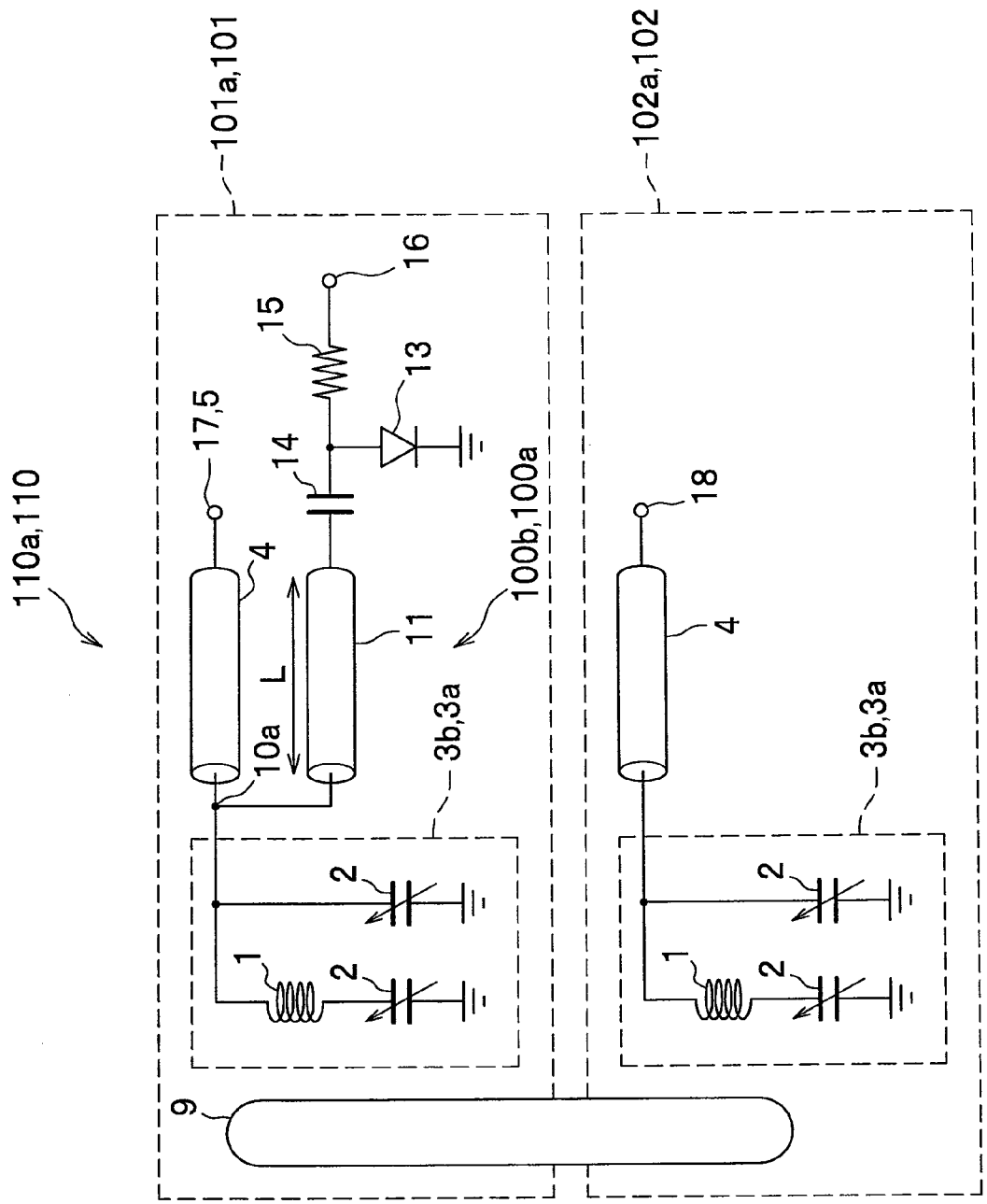
FIG. 2 is a view illustrating an example of the RF transmitting and receiving equipment relating to the first embodiment.

FIG. 2 is a view showing a constitutional example of the RF transmitting and receiving equipment relating to a first embodiment. In FIG. 2, the explanation of the same constituent as FIG. 1 will be omitted by marking the same signs.

The RF transmitting and receiving equipment 110a (110) shows an example provided the RF transmitting and receiving circuit 100b (100a) only in the transmitting side circuit 101a (101).

The RF transmitting and receiving equipment 110a is provided with the transmitting side circuit 101a (101) (transmitting equipment) irradiating (transmitting) the RF signal, and a receiving side circuit 102a (102) (receiving equipment) receiving the RF signal from the RF transmitting and receiving object 400 (sample). In the tuning and matching circuit 3b (3a), a first circuit connecting to the RF coil 1 and the trimming capacitor 2 in series, and a second circuit providing with the trimming capacitor 2 are connected in parallel, together with the transmitting side circuit 101a and the receiving side circuit 102a. Both the first circuit and the second circuit are connected to ground.

Although the tuning and matching circuit 3b in FIG. 2 has one RF coil 1 and two trimming capacitors, it may be provided as needed.

The RF terminal 17 (5) is a terminal connecting to outside circuits such as the transmitting signal generating circuit as not shown.

Although the RF coil 1 and the RF transmitting and receiving object 9 are separately shown in order to avoid the sophisticated figures, the RF transmitting and receiving object 9 is, in fact, designed to be provided in the RF coil 1.

The RF transmitting and receiving circuit 100b (transmitting side circuit 101a) has a diode 13. As the diode control voltage is applied from the transmitting side control terminal 16 to the diode 13, the RF transmitting and receiving circuit 100b (100a) are connected to a DC cut capacitor 14 and a resistance for controlling electric current as needed. That is, the capacitor 14, the resistance 15 and the diode 13 are equivalent to the switch part 12 in FIG. 1. As the signal communication channel such as semi rigid cable is used as the wavelength wire 11, the length L is defined by an expression (1), in consideration of a wavelength shortage ratio prescribed by insulator (or dielectrics) of semi rigid cables.

In addition, a typical value of the wavelength shortage ratio in the wavelength wire 11 ranges from 66 to 70 percentages.

The receiving side circuit 102a has the tuning and matching circuit 3b (3a) as being the same constitution as the transmitting side circuit 101a. The signal communication wire 4 is provided between the tuning and matching circuit 3b and the RF terminal 18. The RF terminal 18 is a terminal connecting to the outside circuits such as a receiving signal analyzing circuit as not shown.

In the RF transmitting and receiving circuit 100b of the transmitting side circuit 101a, the diode 13 becomes ON by applying the voltage to the transmitting side control terminal 16 at the time of transmitting the RF signal (a condition in use of the transmitting circuit and a condition in nonuse of the receiving circuit). This is equivalent to a condition connecting to ground in the switch part 12 in FIG. 1. As the RF transmitting and receiving circuit 100b of the transmitting side circuit 101a is not applied voltage to the transmitting side control terminal 16 at the time of receiving the RF signal (a condition of nonuse of the transmitting circuit and a condition of use of the receiving circuit), the diode 13 becomes OFF. This is equivalent to a condition not to ground in the switch part 12 in FIG. 1.

Figure 3:
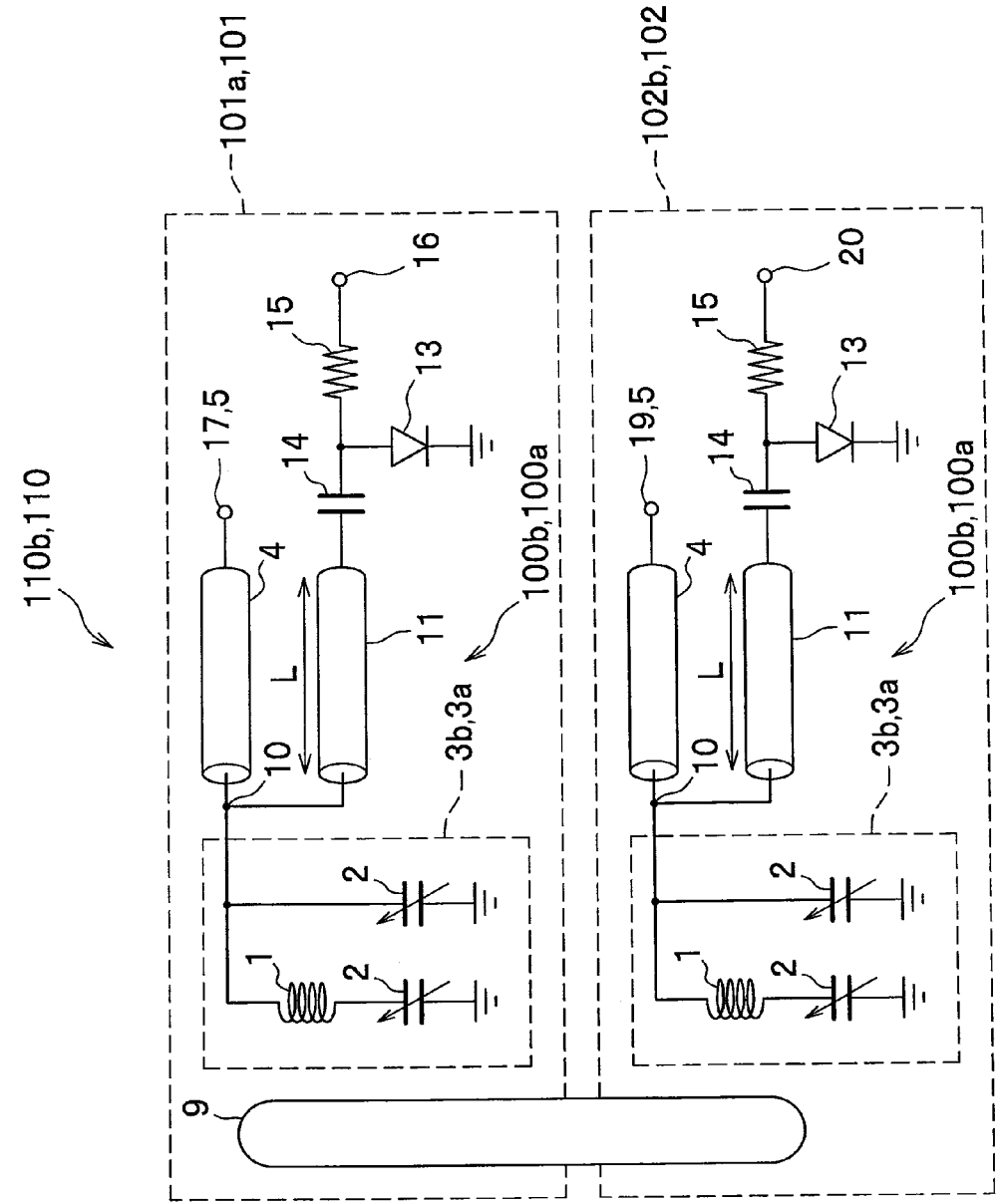
FIG. 3 is a view illustrating another example of the RF transmitting and receiving equipment relating to the first embodiment.

FIG. 3 is a view showing another constitutional example of the RF transmitting and receiving equipment relating to the first embodiment. In FIG. 3, the explanation of the same element as the element in FIGS. 1 and 2 is omitted by marking the same sign.

The RF transmitting and receiving equipment 110b (110) shown in FIG. 3 is constituted to have the RF transmitting and receiving circuit 110b (110a) together with the transmitting side circuit 101a (101) and the receiving side circuit 102b (102).

An explanation of the constitution of the RF transmitting and receiving circuit 100b provided in the transmitting side circuit 101a and the receiving side circuit 102b will be omitted, as it is the same constitution as one shown in FIG. 2. An operation of the RF transmitting and receiving circuit 100b in the transmitting side circuit 101a will be also omitted by the same sign as one shown in FIG. 2.

The RF transmitting and receiving circuit 100b of the receiving side circuit 102b is designed to apply voltage to the receiving side control terminal 20 at the time of receiving the RF signal (at the time of a condition in nonuse of the transmitting circuit and a condition in use of the receiving circuit). Then, the diode 13 becomes ON and it is equivalent to a grounded condition in the switch part 12 in FIG. 1. On the other hand, the RF transmitting and receiving circuit 100b of the receiving side circuit 102b is designed not to apply voltage to the receiving side control terminal 20 at the time of transmitting the RF signal (at the time of being a condition in use of the transmitting circuit and a condition in nonuse of the receiving circuit). Then, the diode 13 becomes OFF and it is equivalent to an ungrounded condition in the switch part 12 in FIG. 1.

In addition, the RF terminal 19 (5) is a terminal for connecting outside circuits such as a receiving signal analyzing circuit as not shown.

Although the receiving side circuit 102a as shown in FIG. 2 is always in a condition in use, the receiving side circuit 102b in an example shown in FIG. 3 is designed to change over between a condition in use and in nonuse. It can be prevented from transmitting the RF signal from the transmitting side circuit 101a to the receiving side circuit 102b by the condition in nonuse of the receiving side circuit 102b. Accordingly, effects such as enhancing the efficiency of the transmitting side circuit 101a, distributing the RF magnetic field as desired, and making fast the starting time of receiving signals can be obtained.

In addition, it may be designed to provide the RF transmitting and receiving circuit 100a in the receiving side circuit 102 and not to provide the RF transmitting and receiving circuit 100a in the transmitting side circuit 101. In this case, the transmitting side circuit 101 becomes the same constitution, for example, as the receiving side circuit 102a shown in FIG. 2.

Figure 4:
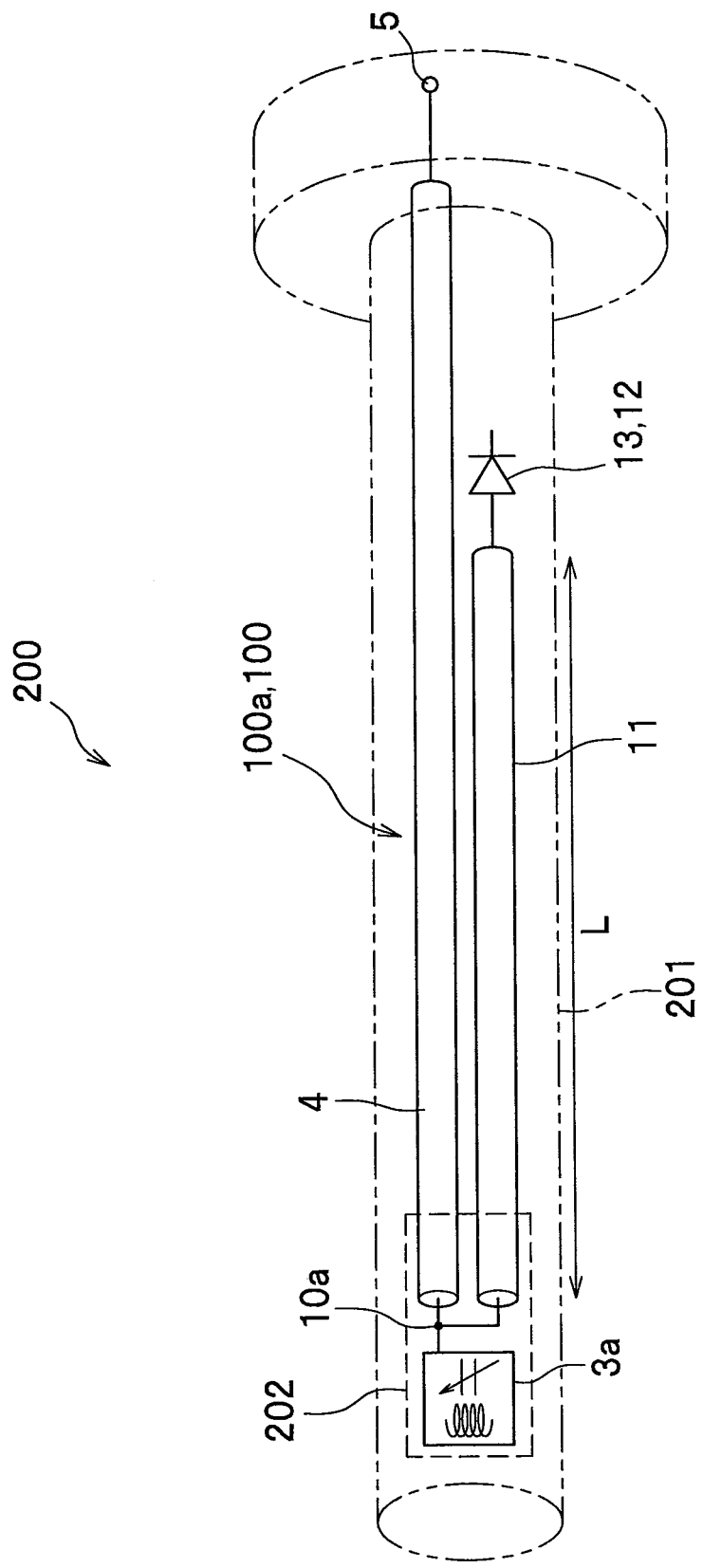
FIG. 4 is a view illustrating an example of NMR probe relating to the first embodiment.

FIG. 4 is a view showing an example of NMR probe relating to the first embodiment. In FIG. 4, an explanation of the same constituent element as one in FIGS. 1 to 3 will be omitted by the same sign.

An NMR probe 200 shown in FIG. 4 is designed to store the RF transmitting and receiving circuit 100a (100) in a case 201. The RF transmitting and receiving circuit 100a is the same constitution as the RF transmitting and receiving circuit 100a, 100b and the like, as shown in FIGS. 1 to 3. The switch part 12 is constituted to provide with the diode 13. The capacitor 14, the resistance 15 and GND in FIGS. 2 and 3 are omitted in description.

Further, when the tuning and matching circuit 3a including the RF coil is cooled down, the thermal noise is decreased and the signal to noise ratio of NMR measurement improves. When a heat exchanger as not shown for cooling down the tuning and matching circuit 3a is arranged in the case 201 of the NMR probe 200, it can cool down the surroundings of the tuning and matching circuit 3a. As an example of the temperature, a temperature of the tuning and matching circuit 3a is designated as 20 K degrees and the operation guarantee temperature of the diode 13 is designated as 120 K degrees. The use of wavelength wire 11 can keep the diode 13 to be far away from low-temperature area 202 in the surroundings of the tuning and matching circuit 3a. Thus, the diode 13 can be arranged in the area within the operation guarantee temperature. Although only the transmitting side circuit is shown in FIG. 4, the receiving side circuit is arranged in the backside as a set. The constitution of the transmitting side circuit and the receiving side circuit may be constituted to arrange the RF transmitting and receiving circuit 100a only in the transmitting side circuit as shown in FIG. 2, and to arrange the RF transmitting and receiving circuit 100a both in the transmitting side circuit 101 and in the receiving side circuit 102.

(Effect)

According to the first embodiment, in the RF transmitting and receiving circuit 100a possible for changing over between a condition in use and a condition in nonuse, Even in a case where the diode 13 as not operated accurately only in a limited area of the magnetic field intensity and the temperature as a means of changing over between a condition in use and a condition in nonuse is used, the diode 13 can be arranged in an area as being accurately operated by connecting the diode 13 ahead of the wavelength wire 11. Thus, it is possible to change over without generating the surplus loss in the transmitting and receiving of the RF transmitting and receiving circuit 100a arranged in the strong magnetic field and the low-temperature area. Thus, it is possible to operate the diode 13 as the switch part 12 accurately. That is, it is possible to provide a RF transmitting and receiving circuit 100a for being more excellent in the transmitting performance and the receiving performance than the case done by only one RF coil 1, and it is possible to provide the RF transmitting and receiving circuit 100a possible for exactly operating the diode 13 as the switch part 12.

As shown in FIG. 1, it can be prevented from the loss in the signal communication wire 4 at a condition in nonuse by connecting the wavelength wire 11 between the tuning and matching circuit 3a and the signal communication wire 4.

The circuit specifying in each role as the transmitting circuit 101 and the receiving circuit 102 can enable a liquid-state NMR and a solid-state NMR to enhance its measuring sensitivity.

Second Embodiment

Figure 5:
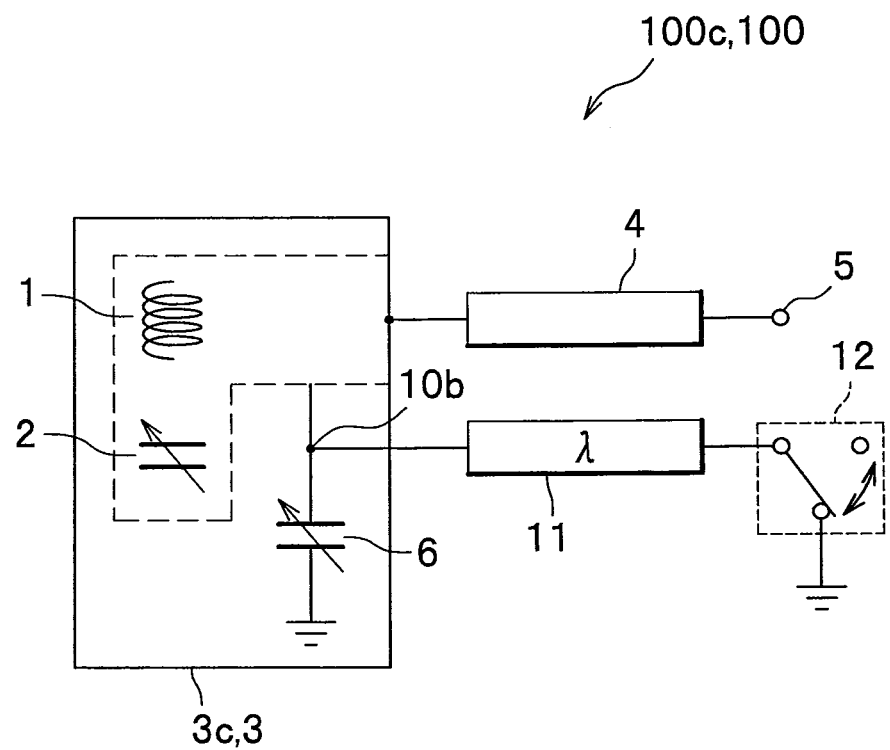
FIG. 5 is a schematic view of the RF transmitting and receiving circuit relating to a second embodiment.

FIG. 5 is a schematic view of the RF transmitting and receiving circuit relating to the second embodiment.

The RF transmitting and receiving circuit 100c (100) (a signal transmitting and receiving circuit) is constituted to have the tuning and matching circuit 3c (3) which irradiates the RF magnetic field (transmitting signal) to the sample and receives electromagnetic signal of the NMR excited in the sample, and the signal communication wire 4 which one side thereof connects to the tuning and matching circuit 3c and the other end thereof connects to the RF terminal 5. As there are so many cases where the transmitting and receiving signal used in the NMR measurement is the RF signal as being more than 10 MHz, the transmitting and receiving signal will be appropriately described as the RF signal. The signal communication wire 4 is wires for communicating the transmitting and receiving signal. The tuning and matching circuit 3c including the RF coil 1, the trimming capacitors, and the like is designed to tune and match to the prescribed frequency by regulating a value of the trimming capacitor 2, to transmit and receive the RF signal between the RF coil 1 and the outside circuit with use of the signal communication wire 4. In addition, although the tuning and matching circuit 3c is a circuit made of the combination of parts such as the RF coil 1 and the trimming capacitor 2, a concrete constitution of the tuning and matching circuit 3c is not shown in FIG. 5, as these circuits are free to select in combination.

The RF transmitting and receiving circuit 100c has a contact point 10b (10) which is an end in the ungrounded side of the trimming capacitor 6 in the tuning and matching circuit 3c. The wavelength wire 11 is so constituted that one end thereof is connected and the other thereof is connected to the switch part 12. The switch part 12 connecting to the wavelength wire 11 is so constituted that one end thereof is connected to ground and the other end is not connected to ground, that is, an ungrounded condition. Although the switch part 12 is preferable as a diode 13, a superconductor or a mechanical switch may be used as the switch part 12. In addition, the trimming capacitor 6 is designed that one end thereof is connected to the contact point 10b and the other end thereof is connected to ground. The trimming capacitor 6 may be a capacitor as being a fixed value in capacity.

Although the RF transmitting and receiving circuit 100c relating to this embodiment may be used as a transmitting and receiving circuit of low frequency signal, it may be used as a transmitting and receiving circuit of the RF signal as being more than 10 MHz.

The tuning and matching circuit 3c including the RF coil 1 is designed to tune and match to a frequency of the RF signal as being an object transmitted in the tuning and matching circuit 3c. The RF signal transmitted from the tuning and matching circuit 3c is transmitted from the outside circuit (not shown) connected to the RF end terminal 5 through the signal communication wire 4 to the tuning and matching circuit 3c. As well, the RF signal received at the tuning and matching circuit 3c is transmitted through the signal communication wire 4 to the outside circuit (not shown) connected to the RF end terminal 5.

The length of the wavelength wire 11 is regulated to a length as the switch part 12 being not influenced by the strong magnetic field disposing the RF transmitting and receiving circuit 100c, as later described.

$$L = N \cdot \lambda/4 \quad (1)$$

where, N=1, 2, 3, . . . .

Herein, a function of the wavelength wire will be described.

At first, it will be described concerning the case when N in the expression (1) is an odd number.

The wavelength wire 11 is designed such that in case of zero in voltage magnitude of one end thereof, the voltage magnitude of the other end thereof becomes a maximal value in reference to a signal of the λ in wavelength or a signal of the number multiplied by odd times in wavelength. In reverse, when the voltage magnitude at one end thereof is a maximal value, the voltage magnitude at the other end thereof becomes zero.

Thus, when one end, that is, the switch part 12 side of the wavelength wire 11 is not connected to ground at the switch part 12, this one end becomes maximal in voltage magnitude, the opposite end, that is, the side of contact point 10b becomes a zero in voltage magnitude. This means that the contact point 10b is the ground (GND).

On the other hand, when one end, that is, the switch part 12 side of the wavelength wire 11 is connected to ground at the switch part 12, as this one end becomes a zero in voltage magnitude, the opposite end, that is, the contact point 10b becomes maximal in voltage magnitude.

Accordingly, the characteristics of the contact point 10b can be changed over between the grounded condition and the ungrounded condition. For example, in a condition where one end, that is, the switch part 12 side of the wavelength wire 11 is connected to ground at the switch part 12, when the tuning and matching circuit 3c be tuned and matched to the desired frequency, the tuning and matching circuit 3c can be changed over between the condition to be tuned and matched and the condition to be out of the tuning and matching area by changing over the switch part 12 between the grounded and ungrounded connection.

In reverse, it is possible that the condition where one end, that is, the switch part 12 side of the wavelength wire 11 is not connected to ground at the switch part 12, when the tuning and matching circuit 3c be tuned and matched to the desired frequency, the tuning and matching circuit 3c can be changed over between the condition to be tuned and matched and the condition to be out of the tuning and matching area by switching the switch part 12.

A condition to be out of the prescribed tuning and matching area means a condition in which there is a gap between the resonance frequency of the receiving side and transmitting side tuning and matching circuit 3c and the frequency of RF signal, and the tuning and matching circuit 3c does not resonate at the frequency of the RF signal. In contrary, a condition to be within the prescribed tuning and matching area (tuning and matching condition) means a condition in which the resonance frequency of the receiving side and transmitting side tuning and matching circuit 3c is in accordance with the frequency of the RF signal, and the tuning and matching circuit 3c resonates at the frequency of the RF signal.

Next, the case, in which N in an expression (1) is an even number, will be described. In this case, when one end of the voltage magnitude is zero, the other end of the voltage magnitude also becomes zero in reference to a signal of the λ in wavelength or a signal of the number multiplied by odd times in wavelength. In contrary, when one end of the voltage magnitude is maximal, the other end of the voltage magnitude also becomes maximal. Then, it is possible to change over the characteristics of the contact point 10b between a grounded condition and an ungrounded condition, and to change over the tuning and matching condition between the tuning and matching condition and the condition to be out of the tuning and matching condition by changing over the switch part 12 between the grounded and ungrounded connection as well as the case where the above N is an odd number.

In this way, changing over the switch part 12 between the grounded and ungrounded condition enables the grounded condition and the ungrounded condition of the contact point 10b to switch. Then, when the contact point 10b becomes the grounded condition, the trimming capacitor 6 does not function. When the contact point 10b becomes the ungrounded condition, the trimming capacitor 6 comes to function. Thus, the tuning and matching circuit 3c comes to change in whole capacity of the capacitor. When the capacity of the capacitor changes, it is possible to change the RF frequency possible for the resonance of the RF transmitting and receiving circuit 100c by changing the impedance of the tuning and matching circuit 3c. That is, it is possible to change over between the tuning and matching condition and the condition to be out of the tuning and matching condition by changing over between the grounded condition and the ungrounded condition of the switch part 12.

Hereinafter, the case where N is an odd number will be described for a simple explanation. The description between the grounded condition and the ungrounded condition of the switch part 12 as the following shown will be shown as an example, and the method of use is not limited thereto. As above mentioned, it is essential that the RF transmitting and receiving circuit 100c can change over between the tuning and matching condition and the condition to be out of the tuning and matching condition by the changeover of this switch part 12.

Figure 6:
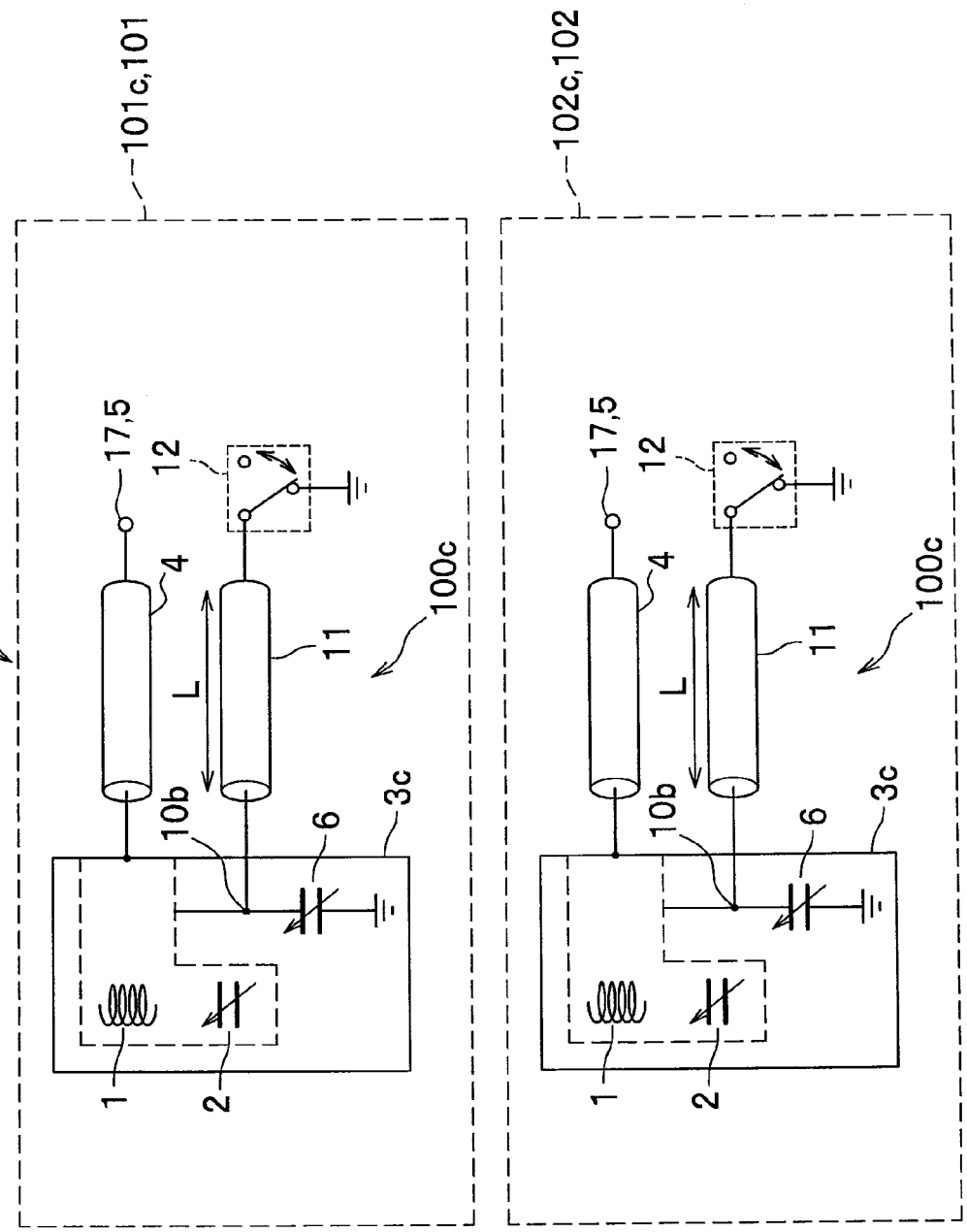
FIG. 6 is a view illustrating an example of the RF transmitting and receiving equipment relating to the second embodiment.

FIG. 6 is a view of a constitutional example of the RF transmitting and receiving equipment relating to the second embodiment.

The RF transmitting and receiving equipment 110c (110) is constituted to separate the RF transmitting and receiving equipment into the transmitting side circuit 101c (101) (transmitting equipment), that is, a transmitting dedicated circuit and the receiving side circuit 102c (102), that is, a receiving dedicated circuit. The RF transmitting and receiving circuit 100c having the same constitution as in FIG. 5 is provided in each of the transmitting side circuit 101c (transmitting equipment) and the receiving side circuit 102c (receiving equipment).

The transmitting side circuit 101c and the receiving side circuit 102c are different in timing between the condition in use and the condition in nonuse. In case of being used as the transmitting side circuit 101c, the time for transmitting is considered as the condition in use, and the time for receiving is considered as the condition in nonuse. On the contrary, in case of being used as the receiving side circuit 102c, the time for transmitting is considered as the condition in nonuse, and the time for receiving is considered as the condition in use. That is, in the transmitting side circuit 101c and the receiving side circuit 102c, the condition to be tuned and matched is considered as the condition in use, and the condition to be not tuned and matched is considered as the condition in nonuse.

This changeover is changed over by the switch part 12. In case of the condition in use of the RF transmitting and receiving circuit 100c, the switch part 12 is changed over in the side connecting to ground. Then, the tuning and matching circuit 3c becomes the tuning and matching condition by the operation of the RF transmitting and receiving circuit 100c. On the other hand, in case of the condition in nonuse, the switch part 12 is changed over in the side connecting not to ground. Then, the tuning and matching circuit 3c becomes the condition to be out of the tuning and matching condition by the non-operation of the trimming capacitor 6.

In addition, in case of changing the trimming capacitor 2 of the tuning and matching circuit 3c and matching the tuning and matching, the switch part 12 remains to be the condition changed over in the side connecting to ground.

On the contrary, the capacity of the capacitor of the tuning and matching circuit 3c is controlled to tune the tuning and matching circuit 3c in case where the trimming capacitor 6 does not function. Then, when the switch part 12 is changed over to the side connecting to ground, it may be considered to be out of the tuning and matching condition, and when the switch part 12 is changed over in the side connecting not to ground, it may be considered to be the tuning and matching condition. In this case, in order to control the tuning and matching by changing the trimming capacitor 2 of the tuning and matching circuit 3c, the switch part 12 remains to be the condition changed over in the side connecting not to ground.

As above mentioned, as the resonance frequency in the tuning and matching circuit of a general transmitting side and receiving side circuit is almost the same, the transmitting and receiving signal transmits to the other and exhausts energy in the tuning and matching circuit 3c, the signal communication wire 4, etc. The losses of the transmitting signal and receiving signal becomes large. When the transmitting signal is transmitted to the receiving side circuit, the RF signal comes to be transferred from the RF coil of the receiving side circuit. Then, it becomes a different condition from the transmitting of the prescribed RF signal.

For example, in a constitutional example of RF transmitting and receiving equipment as shown in FIG. 6, in order to prevent from the transmitting to the transmitting side circuit 101c of the receiving signal, it is possible to prevent from transmitting the receiving signal to the transmitting side circuit 101c, when the tuning and matching circuit 3c in the side of the transmitting side circuit 101c does not tune and match at the time of receiving.

For example, the transmitting side circuit 101c becomes equivalent to an unconnected circuit of the wavelength wire 11 by connecting to ground the switch part 12 in the side of the transmitting side circuit 101c on the basis of the above reason. The tuning and matching condition of the transmitting side circuit 101c is almost kept to be the circuit before the wavelength 11 is connected.

On the other hand, at the time of transmitting, in a case that it refrain from transmitting to the receiving circuit 102c of the transmitting signal, it may be the same constitution by replacing the transmitting side by the receiving side.

Figure 7:
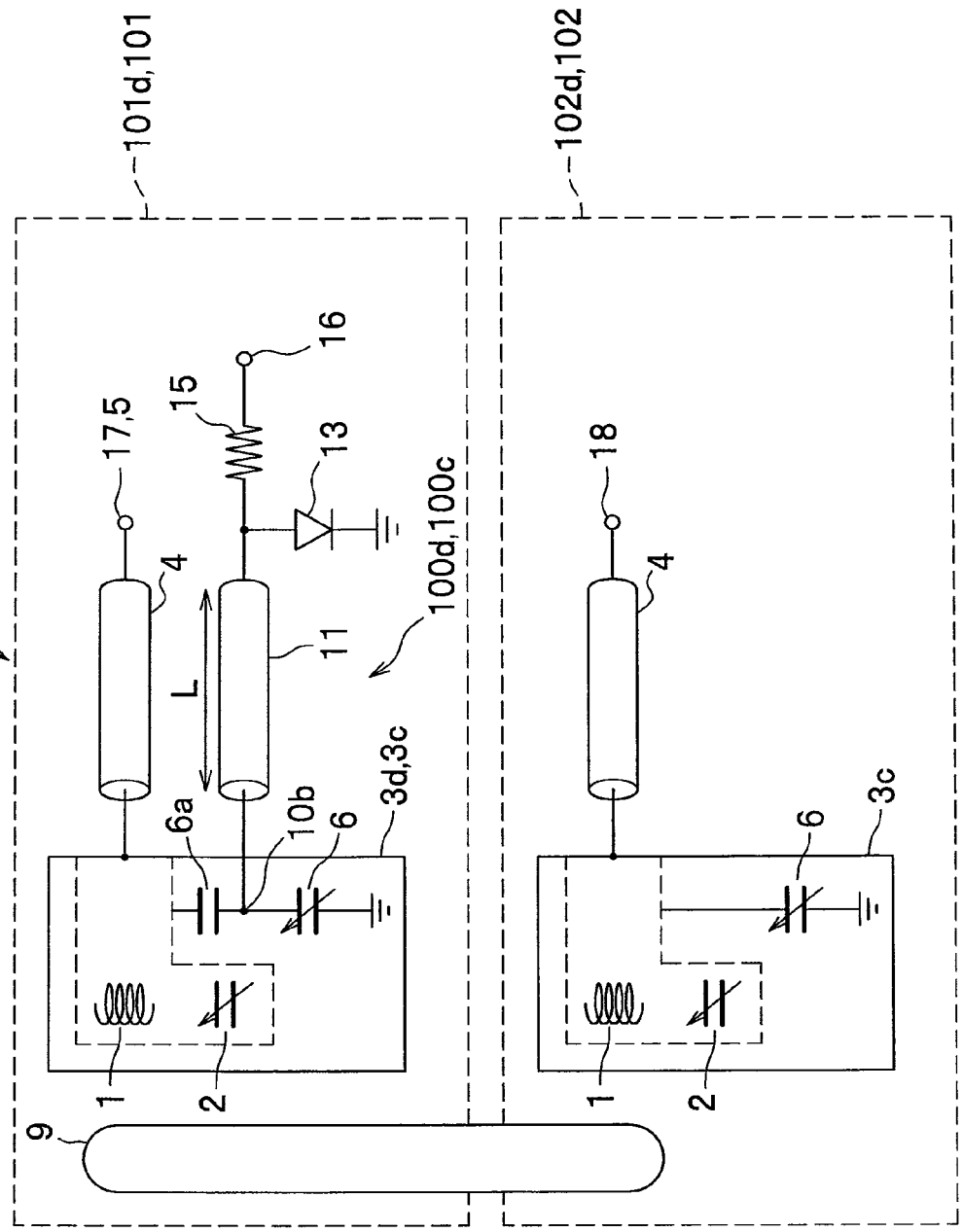
FIG. 7 is a view illustrating another example of the RF transmitting and receiving equipment relating to the second embodiment.
Figure 8:
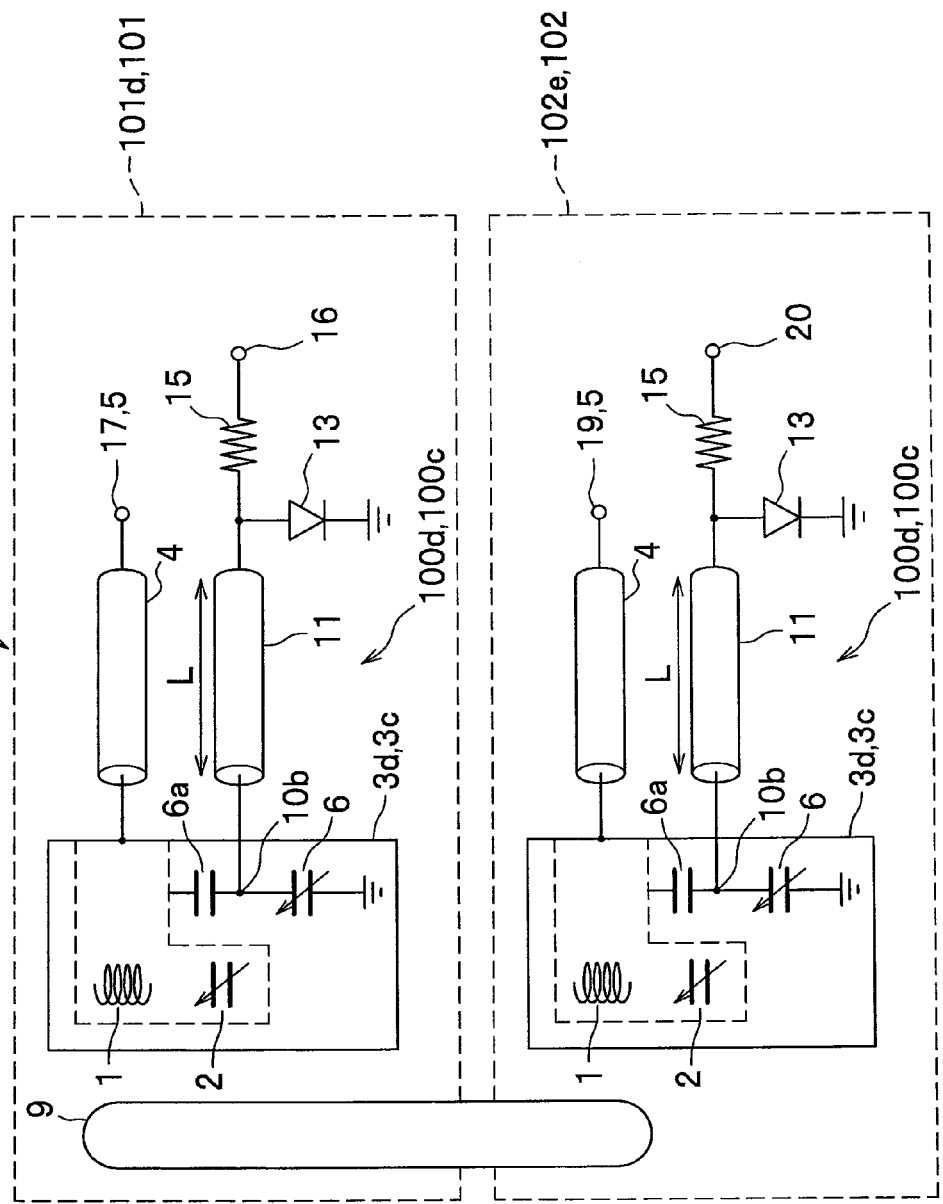
FIG. 8 is a view illustrating another example of the RF transmitting and receiving equipment relating to the second embodiment.

In addition, in order to connect one end of the wavelength wire 11 to ground or open, for example, one end of the wavelength 11 connects to a circuit including a diode 13 as shown in FIGS. 7 and 8 as the switch part 12. Then, it may be transmitted the control signal to the diode 13.

FIG. 7 is a view showing another constitutional example of the RF transmitting and receiving equipment relating to the second embodiment.

The RF transmitting and receiving equipment 110d (110) is an example providing the RF transmitting and receiving circuit 100d (100c) only in the transmitting side circuit 101d (101).

The RF transmitting and receiving equipment 110d is provided with the transmitting side circuit 101d (transmitting equipment) irradiating (transmitting) the RF signal to the RF transmitting and receiving object 9 (sample), and the receiving side circuit 102d (receiving equipment) receiving the RF signal from the RF transmitting and receiving object 9 (sample). The tuning and matching circuit 3d (3c) is provided with the RF coil 1 and one or more trimming capacitors 2, 6 together with the transmitting side circuit 101d and the receiving side circuit 102d.

Although the tuning and matching circuit 3d (3c) as shown in FIG. 7 is provided with one RF coil 1 and two trimming capacitors 2, 6, the RF coil and the trimming capacitor may be provided to add for necessity.

The RF end terminal 17 (5) is an end terminal connecting to the outside circuits such as the transmitting signal generating circuit as not shown.

Although the RF coil 1 and the RF transmitting and receiving object 9 are shown separately in order to prevent from a sophisticated figure, it is, in fact, the form for filling the RF transmitting and receiving object 9 in the RF coil 1.

The RF transmitting and receiving circuit 100d of the transmitting side circuit 100d has a diode 13. As the diode control voltage is applied from the transmitting side control terminal 16 to the diode 13, the DC cut capacitor 6a for cutting the DC component and the resistance 15 for controlling the flow rate is connected for necessity. That is, the resistance 15 and the diode 13 correspond to the switch part 12 as shown in FIG. 5. The characteristics of the tuning and matching circuit 3d (3c) can be maintained to add the DC cut capacitor 6a by fixing the capacity of the DC cut capacitor 6a to be much more that the maximal capacity of the trimming capacitor 6. The wavelength wire 11 is used the signal communication path such as semi rigid cable, the length L is designated by an expression (1) in consideration of the wavelength shorting ratio fixed by the insulator (or dielectrics) of the semi rigid cable.

In addition, a typical value of the wavelength shorting ratio at the wavelength 11 ranges from 66 percentage to 70 percentages. In addition, the DC cut capacitor 6a is arranged to connect the capacitor 6, the contact point 10b, and the DC cut capacitor 6a in series.

The receiving side circuit 102d has the signal communication wire 4 between the tuning and matching circuit 3c including the trimming capacitor 6 and the RF end terminal 18. The tuning and matching circuit 3c in the receiving side circuit 102d is constituted to be the same constitution as the tuning and matching circuit 3c in FIG. 5. The RF end terminal 18 is an end terminal connecting to the outside circuit such as the receiving signal analyzing circuit as not shown.

As the RF transmitting and receiving circuit 100d of the transmitting side circuit 101d is applied voltage to the transmitting side control terminal 16 at the time of transmitting the RF signal (the condition in use of the transmitting circuit and the condition in nonuse of the receiving circuit), the diode 13 becomes ON condition to be equivalent to the condition connecting to ground in the switch part 12 of FIG. 5. As the RF transmitting and receiving circuit 100d of the transmitting side circuit 101d is not applied voltage to the transmitting side control terminal 16 at the time of receiving the RF signal (the condition in nonuse of the transmitting circuit and the condition in use of the receiving circuit), the diode 13 becomes OFF condition to be equivalent to the condition connecting not to ground in the switch part 12 of FIG. 5.

The transmitting side circuit 101d can be out of the tuning and matching at the receiving of the RF signal and obtain the effect for refraining from the loss of the receiving signal by controlling only the tuning and matching of the RF transmitting and receiving circuit 100d at the time of receiving the RF signal.

FIG. 8 is a view showing another constitutional example of the RF transmitting and receiving equipment relating to the second embodiment.

The RF transmitting and receiving equipment 110e (110) as shown in FIG. 8 is constituted to have the RF transmitting and receiving circuit 100d (100c) together with the transmitting side circuit 101d (101) and the receiving side circuit 102e (102).

The constitution of the RF transmitting and receiving circuit 100d provided in the transmitting side circuit 101d and the receiving side circuit 102e will be omitted to describe as the same constitution as shown in FIG. 7. An operation of the RF transmitting and receiving circuit 100d in the transmitting side circuit 101d will be omitted to describe as the same constitution as shown in FIG. 7.

As the RF transmitting and receiving circuit 100d of the receiving side circuit 102e is constituted to apply voltage the receiving side control end terminal 20 at the time of receiving the RF signal (the condition in nonuse of the transmitting circuit and the condition in use of the receiving circuit), it is equivalent to the condition connecting to ground in the switch part 12 as shown in FIG. 5 by the ON condition of the diode 13. As the RF transmitting and receiving circuit 100d of the transmitting side circuit 102e is not applied voltage to the transmitting side control terminal 16 at the time of transmitting the RF signal (the condition in use of the transmitting circuit and the condition in nonuse of the receiving circuit), the diode 13 becomes OFF condition to be equivalent to the condition connecting not to ground in the switch part 12 of FIG. 5.

In addition, the RF end terminal 19(5) is an end terminal connecting the outside circuit such as the receiving signal analyzing circuit as not shown.

The receiving side circuit 102d as shown in FIG. 7 is always in condition in use, the receiving side circuit 102e can also be changed over between the condition in use and the condition in nonuse. The RF signal can prevent from transmitting the RF signal transmitted from the transmitting side circuit 101d to the receiving side circuit 102e by the condition in nonuse of the receiving side circuit 102e. Thus, the various effects such as enhancing or improvement of the efficiency of the transmitting side circuit 101d, realizing the RF magnetic field distribution as intended, and achieving the earlier starting time of receiving signal can be obtained.

It may be designed to provide the RF transmitting and receiving circuit 100c in the receiving side circuit 102 and not to provide the RF transmitting and receiving circuit 100c in the transmitting side circuit 101. In this case, the constitution of the transmitting side circuit 101 may be the same constitution as, for example, the receiving side circuit 102d as shown in FIG. 7.

FIG. 9 is a view showing an example of the measuring effect in case of changing over between the condition as tuned and matched and the condition as not tuned and matched in the receiving side circuit and the transmitting side circuit.

Figure 9A:
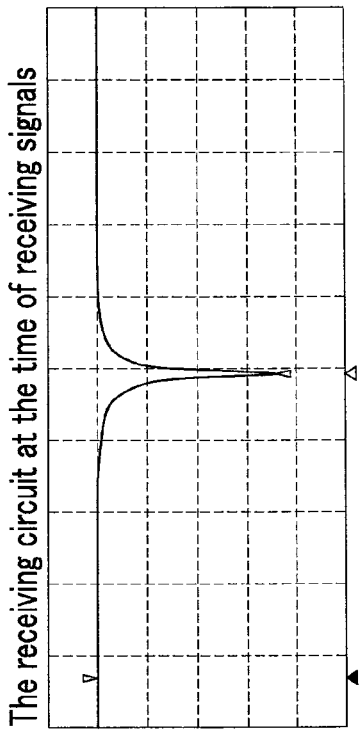
FIG. 9 is a view showing an estimation result of the characteristics of the RF transmitting and receiving equipment relating to the second embodiment.
Figure 9B:
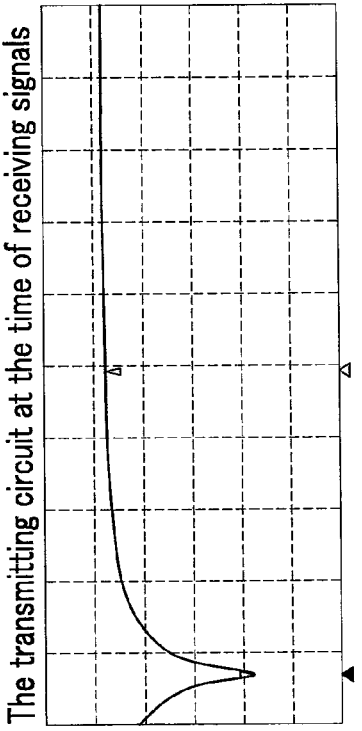
Figure 9C:
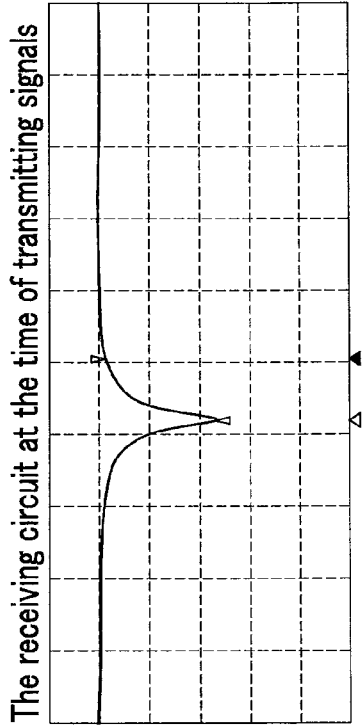
Figure 9D:
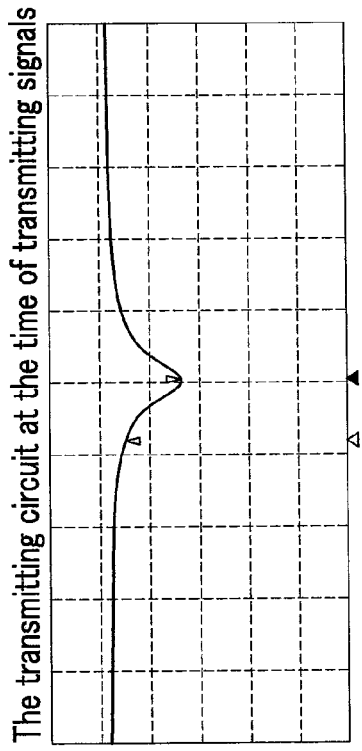

In this Figure, the transmitting side circuit 101 and the receiving side circuit 102 used in measuring is the same constitution as shown in FIG. 8. FIG. 9A shows the characteristics of the receiving side circuit 102 at the time of transmitting signals and FIG. 9B shows the characteristics of the transmitting side circuit 101 at the time of transmitting. FIG. 9C shows the characteristics of the receiving side circuit 102 at the time of receiving, and FIG. 9D shows the characteristics of the transmitting side circuit 101 at the time of receiving. The frequency of the RF signal as an object for transmitting and receiving is a frequency positioned at an approximately central position of the horizontal axis of graph to be a frequency equivalent to the wave bottom in FIGS. 9B and 9C.

Comparing between FIGS. 9A and 9B, it is understood that a position of wave bottom is different between the receiving side circuit 102 and the transmitting side circuit 101 at the time of transmitting. As the position of the wave bottom means a resonating frequency, the transmitting side circuit 101 resonates at a frequency of the RF signal as being an object of the transmitting and receiving signal in FIGS. 9A and 9B, and the receiving side circuit 102 does not resonate at a frequency of the RF signal as being an object of the transmitting and receiving. This becomes an inverse relationship between in FIGS. 9C and 9D. Accordingly, it has been ascertained by the above experiments that the changeover between the condition as tuned and matched and the condition as not tuned and not matched as shown in FIG. 9 can be obtained by the ON or OFF operation of the diode 13 (the switch part 12).

Figure 10:
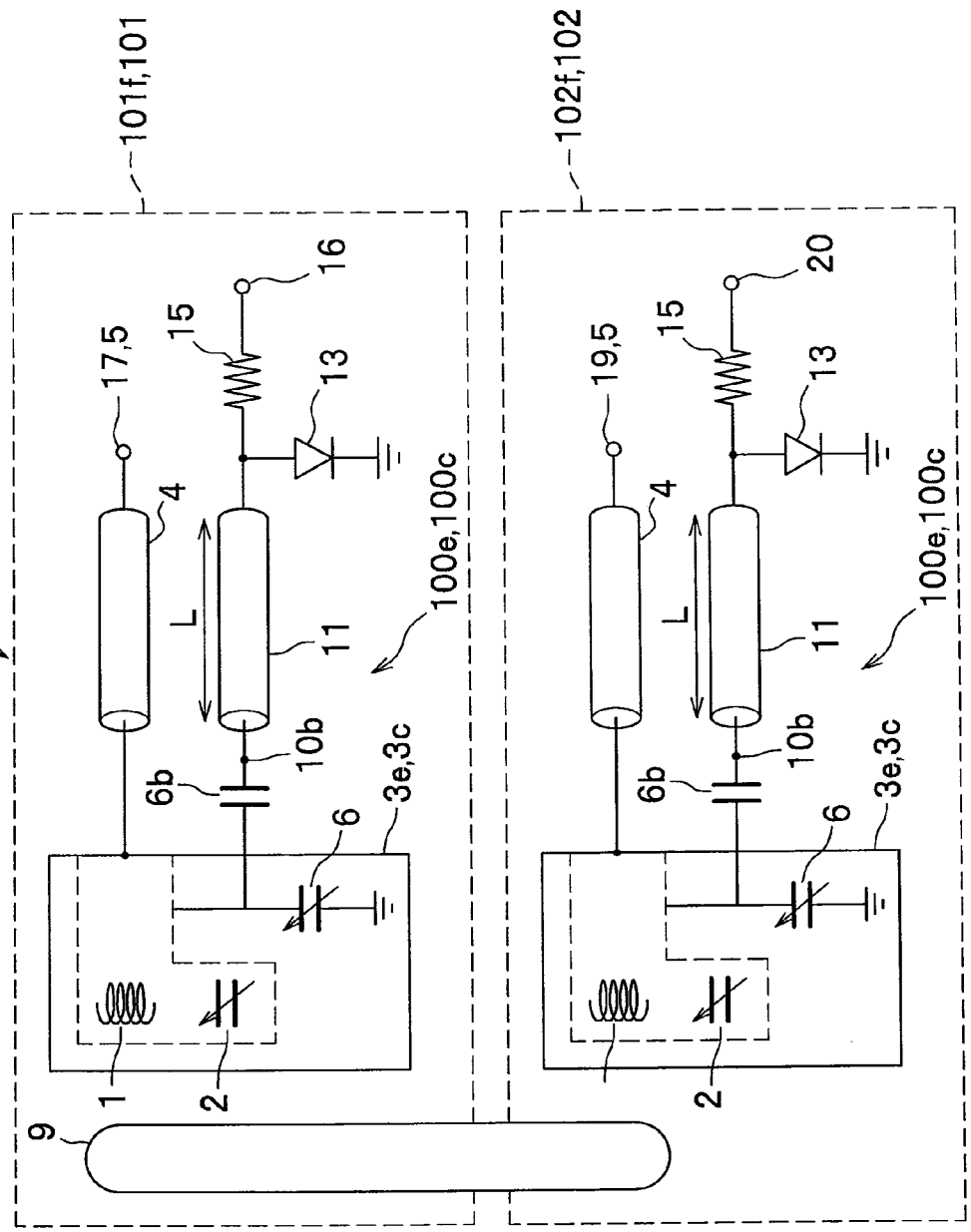
FIG. 10 is a view illustrating another example of the RF transmitting and receiving equipment relating to the second embodiment.

FIG. 10 is a view showing another example of the RF transmitting and receiving equipment relating to the second embodiment.

The RF transmitting and receiving circuit 100e (100c) is an example constituted to dispose the DC cut capacitor 6b between the wavelength wire 11 and the tuning and matching circuit 3e (3c). The DC cut capacitor 6b in FIG. 10 is arranged to connect the capacitor 6, the DC cut capacitor 6b, and the contact point 10b in series. When the contact point 10b is connected to ground (GND), the DC cut capacitor 6b is constituted to connect in parallel with the capacitor 6.

In this constitution, the changeover of the contact point 10b between GND and non GND enables the tuning and matching circuit 3e to change over between the condition as tuned and matched and the condition as not tuned and not matched. However, when the contact point 10b is, for example, the GND, the value of capacity of the DC cut capacitor 6b is made to add to the value of capacity of the trimming capacitor 6, as the DC cut capacitor 6b and the trimming capacitor 6 is in a relationship of parallel connection. Thus, the value of capacity of the DC cut capacitor 6b should be a value of the tuning and matching circuit 3e to become a condition as tuned and matched in consideration of the value of capacity of the capacitor 6.

FIG. 10, it may be designed to provide the RF transmitting and receiving circuit 100e only in the transmitting side circuit 101f (101), and the RF transmitting and receiving circuit 100e only in the receiving side circuit 102f (102).

Figure 11:
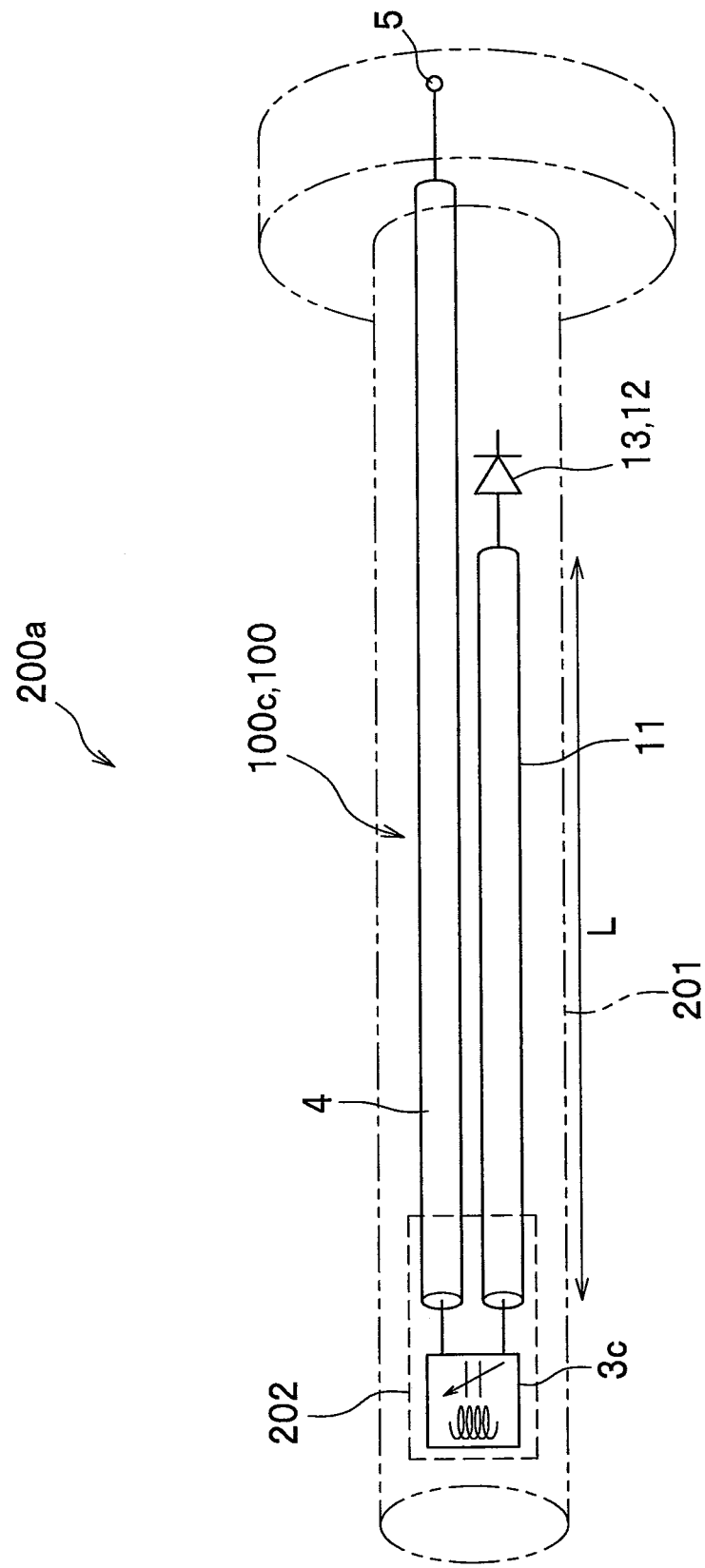
FIG. 11 is a view illustrating an example of a NMR probe relating to the second embodiment.

FIG. 11 is a view showing an example of the NMR probe relating to the second embodiment.

In the NMR probe 200a as shown in FIG. 11, the RF transmitting and receiving circuit 100c (100) is stored in a case 201. The RF transmitting and receiving circuit 100c is designed to be the same constitution as circuits such as the RF transmitting and receiving circuit 100c, 100d, 100e, as shown in FIGS. 5, 6, 7, 8, and 10. However, the trimming capacitor 6, the contact point 10b, the DC cut capacitors 6a, 6b and the GND is omitted so as to avoid a complicated figure. In addition, the resistance 15 in FIGS. 7, 8, and 10 is omitted in FIG. 11.

When the tuning and matching circuit 3c including the RF coil is cooled down, the thermal noise degrades and the Signal-Noise ratio of NMR measuring improves. Thus, when the heat exchanger, as not shown, for cooling down the tuning and matching circuit 3c is arranged in the case 201 of the NMR probe 200a, the surroundings of the tuning and matching circuit 3c may be often cooled down thereby. As an example of the temperature, a temperature of the tuning and matching circuit 3c is designated as 20 K degrees and the operation guarantee temperature of the diode 13 is designated as 120 K degrees. As shown in this embodiment, the diode 13 as the switch part 12 is positioned to be far away from the low-temperature area 202 in the surroundings of the tuning and matching circuit 3c with use of the wavelength wire 11. Thus, the diode 13 can be arranged in the operation guarantee temperature. Although only the transmitting side circuit is illustrated in FIG. 11, the receiving side circuit is arranged in the back as a set. The transmitting side circuit and the receiving side circuit may be constituted to provide the RF transmitting and receiving circuit 100c only in the transmitting side circuit as shown in FIG. 7, and to provide the RF transmitting and receiving circuit 100d, 100e both in the transmitting side circuit 101 and in the receiving side circuit 102.

Figure 12:
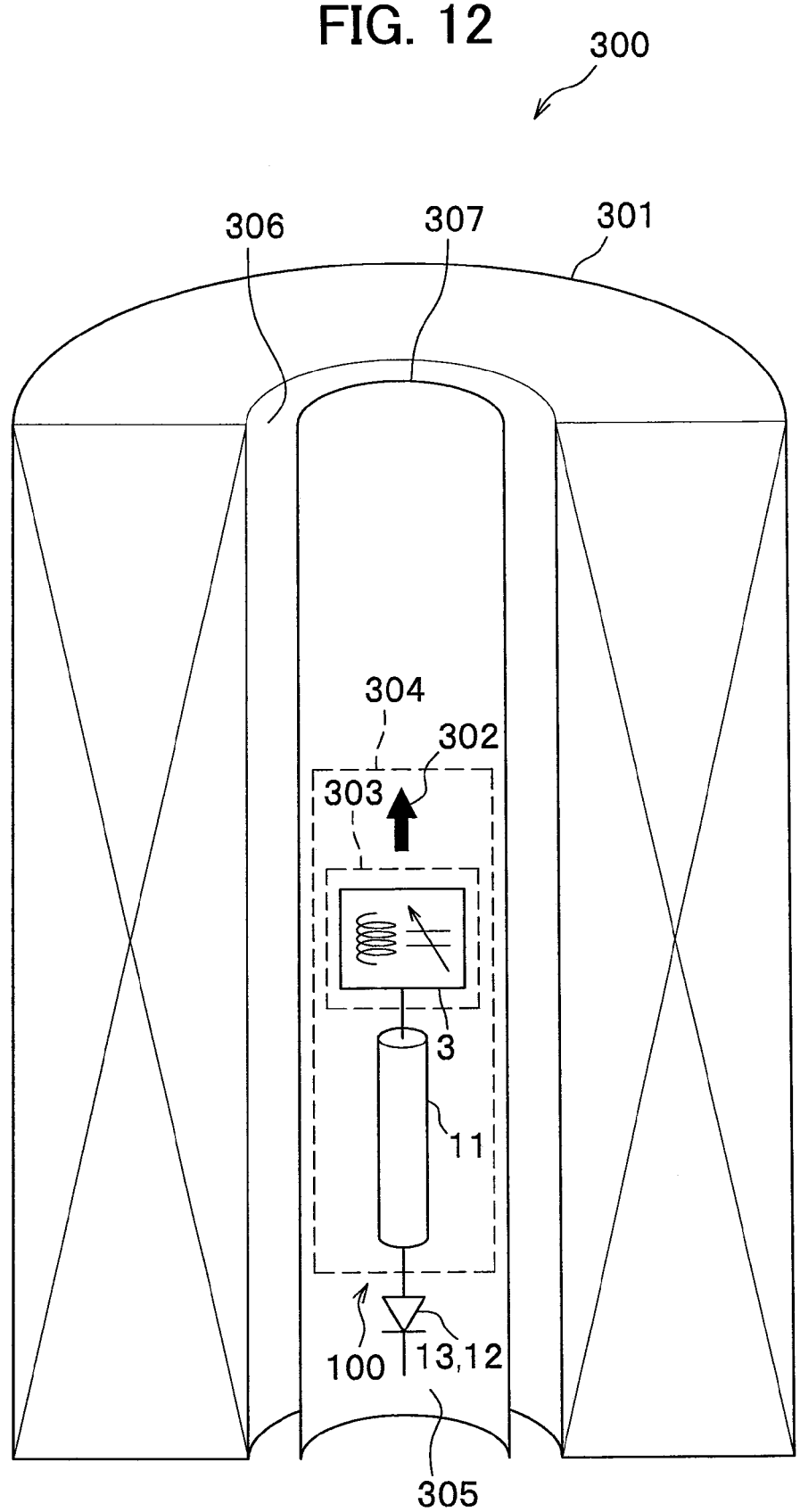
FIG. 12 is a view illustrating an example of a NMR measuring system relating to the present embodiment.

FIG. 12 is a view showing an example of NMR measuring system relating to embodiments.

The NMR measuring system 300 (nuclear magnetic resonance equipment) is constituted to insert the RF transmitting and receiving circuit 100 in the measuring space 305 in the magnet for generating static magnetic field 301. The measuring space 305 is separated by a bore 307. The magnet for generating static magnetic field 301 is arranged in the refrigerant, and the space formed between the bore 307 and the magnet for generating the static magnetic field (space 306) is filled with the refrigerant. Although the vacuum heat-insulation layer and the like are arranged between the bore 307 and the refrigerant, it is omitted in the figure.

As the RF transmitting and receiving circuit 100 is constituted to be the same as the constitution of the RF transmitting and receiving circuit 100 as shown in FIGS. 4 and 11, it is omitted by the same sign in a corresponding element. Elements such as the signal communication wire 4 (FIGS. 1 and 5) and the RF end terminal 5 (FIGS. 1 and 5) are omitted so as to avoid a complicated figure. Although the RF transmitting and receiving circuit 100 is mounted in the probe 200, 200a covered with the case 201 as shown in FIGS. 4 and 11, the constitution of the probe 200, 200a is omitted in FIGS. 12 to 14 so as to be complicated.

In general, the measuring space 305 is coaxially mounted in an axis of the magnet for generating static magnetic field 301 as shown in FIG. 12. Although a direction for the static magnetic field 302 may be a vertical direction in the example shown in FIG. 12, it may be a horizontal direction. That is, the magnet for generating the static magnetic field 301 may be horizontally mounted. As an example, the magnetic field intensity around the center of the static magnetic field (an area designated by a dotted line 303) is supposed to be 20 Tesla. When the magnetic field intensity guaranteeing the operation of the diode 13 as used is 3 Tesla or less, the diode 13 is designed to regulate the length of the wavelength wire 11 to be disposed out of the area (an area shown by a dotted line 304) of the magnetic field intensity of 3 Tesla, in a case where the tuning and matching circuit 3 is disposed in an area (an area 303) around the center of the static magnetic field as being the largest magnetic field intensity. As above mentioned, a length of the wavelength wire 11 is designated by the expression (1). The magnetic field intensity placed around the center of the static magnetic field as herein described and the magnetic field intensity guaranteeing the operation of the diode 13 are given as an example, and the length of the wavelength wire 11 may be regulated so as to be far away from the center of magnetic field to the magnetic field intensity area to accurately operate the diode 13. That is, the diode 13 can be disposed in the magnetic field intensity area guaranteeing the operation thereof.

Although only one of the transmitting side circuit and the receiving side circuit is shown as an example in FIG. 12, a pair of the transmitting side circuit and the receiving side circuit is, in reality, stored in the NMR probe 200 (FIG. 4) and 200a (FIG. 11) to mount in the measuring space 305.

Figure 13:
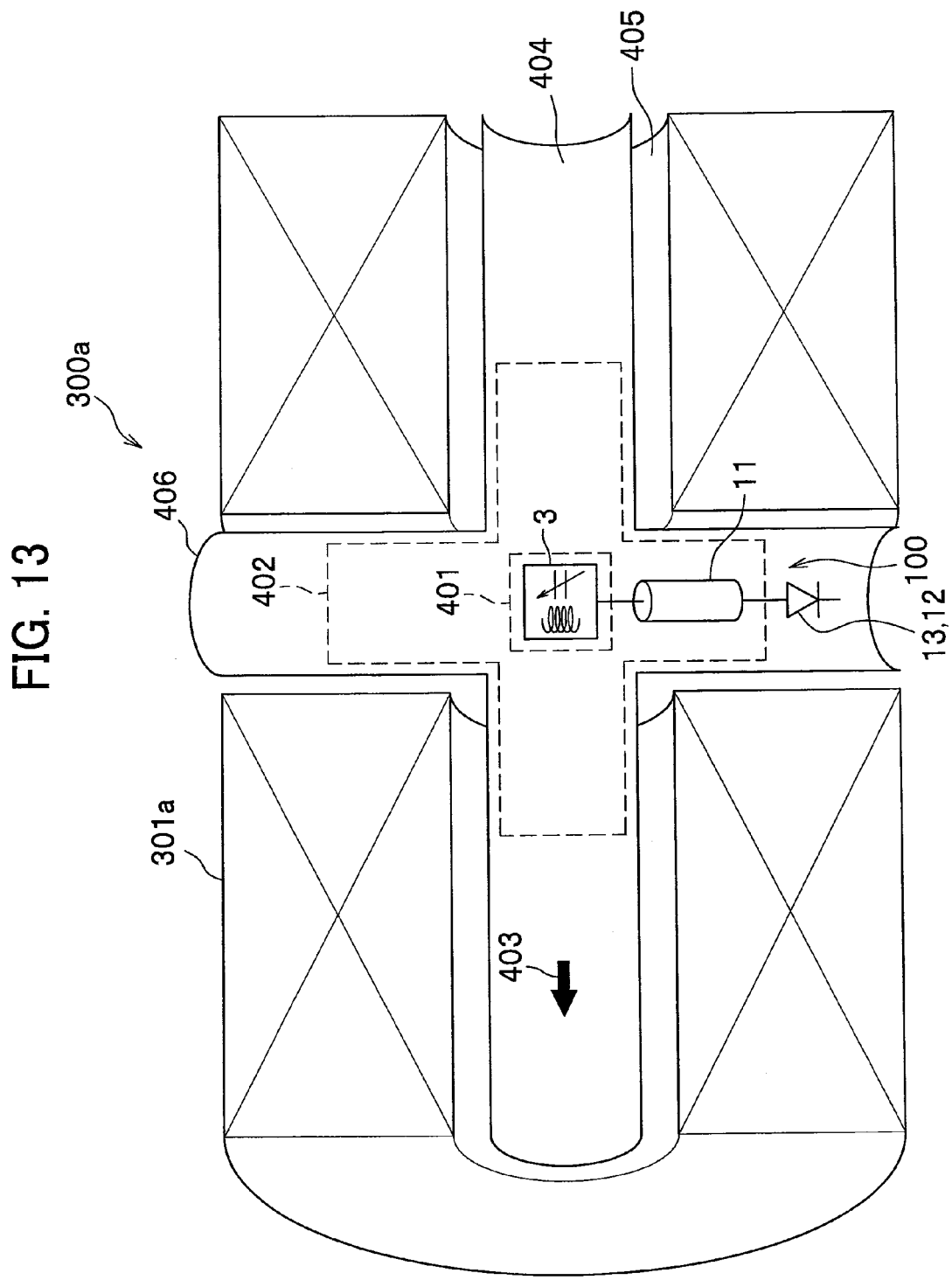
FIG. 13 is a view illustrating another example of the NMR measuring system relating to the present embodiment. (the first)
Figure 14:
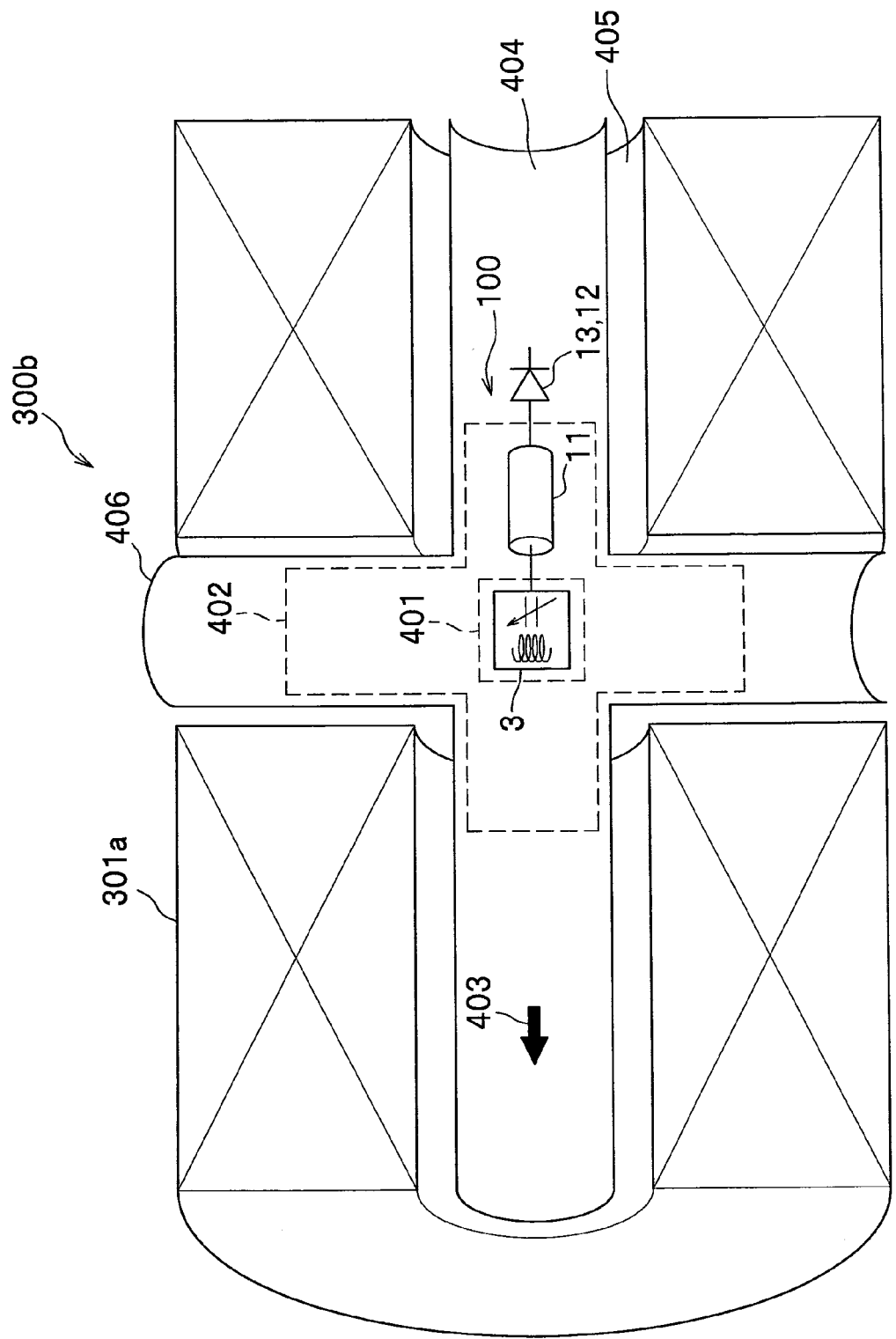
FIG. 14 is a view illustrating another example of the NMR measuring system relating to the present embodiment. (the second)

FIGS. 13 and 14 are views showing another example of the NMR measuring system relating to embodiments. In FIG. 13 as well, the NMR measuring system 300a is constituted to insert the RF transmitting and receiving circuit 100 into the measuring space 404 in the magnet for generating the static magnetic field 301a. The measuring space 404 is separated by the bore 406. The magnet for generating the static magnetic field 301a is disposed in the refrigerant, and the space (space 405) formed between the bore 406 and the magnet for generating the static magnetic field 301a is also filled with the refrigerant. Although the vacuum heat-insulation layer and the like are disposed between the bore 4506 and the refrigerant, it is omitted in this description.

The feature, in which the NMR measuring system 300a is different from the NMR measuring system 300 in FIG. 12, is that the measuring space 404 is formed like a cross and is designed to insert the RF transmitting and receiving circuit 100 not only in a parallel direction but also in an orthogonal direction relative to a direction of the static magnetic field 403.

FIG. 13 is a view inserting the RF transmitting and receiving circuit 100 in an orthogonal direction relative to a direction of static magnetic field 403. As the RF transmitting and receiving circuit 100 is constituted to be the same as the RF transmitting and receiving circuit 100 in FIG. 7, the explanation thereof is omitted. Although the RF transmitting and receiving circuit 100 is constituted to be the NMR probe (FIG. 4) 200, 200a surrounded by the case 201 (FIGS. 4 and 11), the constitution of the NMR probe 200, 200a is omitted so as to avoid the complicated figures. Further, although only one of the transmitting side circuit or the receiving side circuit is shown in FIG. 13, the transmitting side circuit and the receiving side circuit are, in fact, stored as a pair in the NMR probe 200 (FIG. 4), 200a (FIG. 11) to be mounted in the measuring space 404.

FIG. 13, as well as FIG. 12, the magnetic field intensity around the center of the static magnetic field is supposed to be 20 Tesla, and the magnetic field intensity guaranteeing the operation of the diode 13 is supposed to be 3 Tesla or less. Then, when the tuning and matching circuit 3 is arranged in an area (an area shown by a dotted line 401) positioned around the center of the static magnetic field having a largest value of the magnetic field intensity, the diode 13 is arranged by the use of wavelength wire 11 to be far away from the measuring space toward a vertical direction or a horizontal direction along the measuring space so as to arrange the diode 13 in the magnetic field are (outside an area shown by a dotted line 402) guaranteeing the operation of the diode 13.

The NMR measuring system 300b in FIG. 14 is constituted to insert the RF transmitting and receiving circuit 100 in a parallel direction relative to the direction of the static magnetic field 403. The constitution besides the above is omitted, as it is the same as the constitution in FIG. 13.

Each example shown in this embodiment can be applied to both the liquid-state NMR measuring system as being an object measuring the liquid sample and the solid-state NMR measuring system as being an object measuring the solid sample.

(Effect)

According to the second embodiment, in addition to the effect of the first embodiment, the resonance frequency of the tuning and matching circuit 3b can be altered by connecting the wavelength wire 11 to an ungrounded side of the trimming capacitor 2 arranged in the tuning and matching circuit 3b to be out of tuning and matching as shown in FIG. 5 etc. Therefore, it can be preventing from transmitting signals to the nonuse side of circuits.

What is claimed is:

1. A signal transmitting and receiving circuit for transmitting and receiving signals, the signal transmitting and receiving circuit comprising:
    a tuning and matching circuit for transmitting and receiving the signals;
    a signal communication wire for transmitting the signals;
    a wavelength wire having a length L defined as $L=N*(\lambda/4)$, where N is a positive integer and $\lambda$ is a wavelength of the signals; and
    a switch part for changing over between a grounded connection and an ungrounded connection, wherein:
    the tuning and matching circuit is connected to the signal communication wire,
    a first end of the wavelength wire is connected between the tuning and matching circuit and the signal communication wire, and a second end of the wavelength wire is connected to the switch part,
    if N is an odd number, the switch part changes over to the grounded connection in use and the ungrounded connection in nonuse, and
    if N is an even number, the switch part changes over to the ungrounded connection in use and the grounded connection in nonuse.

2. A signal transmitting and receiving circuit according to claim 1, wherein the switch part is a circuit including one or more diodes.

3. A signal transmitting and receiving circuit according to claim 1, wherein:
    the tuning and matching circuit is arranged in a magnetic field, and
    the length L of the wavelength wire is arranged in an area of magnetic field intensity in which an operation of the switch part is guaranteed.

4. A signal transmitting and receiving circuit according to claim 1, wherein the length L of the wavelength wire is arranged in an area of temperatures in which an operation of the switch part is guaranteed, when the tuning and matching circuit is cooled down.

5. A signal transmitting and receiving circuit according to claim 1, wherein each of the signals is an electromagnetic wave signal having a frequency of 10 MHz or more.

6. A signal transmitting and receiving equipment comprising a transmitting equipment and a receiving equipment, wherein at least one of the transmitting equipment or the receiving equipment includes the signal transmitting and receiving circuit according to claim 1.

7. A NMR probe for transmitting and receiving nuclear magnetic resonance signals, the NMR probe comprising a transmitting equipment and a receiving equipment, wherein at least one of the transmitting equipment or the receiving equipment includes the signal transmitting and receiving circuit according to claim 1.

8. A nuclear magnetic resonance equipment comprising:
    a transmitting equipment for irradiating signals for exciting nuclear magnetic resonance signals in a sample,
    a receiving equipment for receiving the nuclear magnetic resonance signals, and
    a magnet for generating a static magnetic field in the sample,
    wherein at least one of the transmitting equipment or the receiving equipment includes the signal transmitting and receiving circuit according to claim 1.

9. A nuclear magnetic resonance equipment comprising:
    a transmitting equipment for irradiating signals for exciting nuclear magnetic resonance signals in a sample,
    a receiving equipment for receiving the nuclear magnetic resonance signals, and
    a magnet for generating a static magnetic field in the sample, wherein:
    the magnet is arranged such that a direction of the static magnetic field is a vertical direction or a horizontal direction,
    a bore of the magnet is arranged parallel or orthogonal to the direction of the static magnetic field, and
    at least one of the transmitting equipment or the receiving equipment includes the signal transmitting and receiving circuit according to claim 1.

10. A signal transmitting and receiving circuit for transmitting and receiving signals, the signal transmitting and receiving circuit comprising:
    a tuning and matching circuit for transmitting and receiving the signals, wherein the tuning and matching circuit comprises a first capacitor having a first end connected to ground;
    a signal communication wire for transmitting the signals;

a wavelength wire having a length L defined as L=N*(λ/4), where N is a positive integer and λ is a wavelength of the signals; and
a switch part for changing over between a grounded connection and an ungrounded connection, wherein:
the tuning and matching circuit is connected to the signal communication wire,
a first end of the wavelength wire is connected to an ungrounded side of the first capacitor, and a second end of the wavelength wire is connected to the switch part,
the tuning and matching circuit is set to tune and match into a frequency of the signals if the switch part is changed over between the grounded connection and the ungrounded connection,
if the tuning and matching circuit is set to tune and match into the frequency of the signals when the switch part is changed over to the grounded connection, the switch part is changed over to the grounded connection in use and to the ungrounded connection in nonuse, and
if the tuning and matching circuit is set to tune and match into the frequency of the signals when the switch part is changed over to the ungrounded connection, the switch part is changed over to the ungrounded connection in use and to the grounded connection in nonuse.

11. A signal transmitting and receiving circuit for transmitting and receiving signals, the signal transmitting and receiving circuit comprising:
a tuning and matching circuit for transmitting and receiving the signals, wherein the tuning and matching circuit comprises a first capacitor and at least one second capacitor, each having a first end connected to ground;
a signal communication wire for transmitting the signals;
a wavelength wire having a length L defined as L=N*(λ/4), where N is a positive integer and λ is a wavelength of the signals; and
a switch part for changing over between a grounded connection and an ungrounded connection, wherein:
the tuning and matching circuit is connected to the signal communication wire,
a first end of the wavelength wire is connected to the switch part,
the wavelength wire, the first capacitor, and the at least one second capacitor are configured such that:
  a second end of the wavelength wire is connected to a first end of the at least one second capacitor, and a second end of the at least one second capacitor is connected to an ungrounded side of the first capacitor,
  the second end of the wavelength wire is connected to ungrounded sides of each of the first capacitor and the at least one second capacitor, and the second end of the at least one second capacitor is connected to an element provided in the tuning and matching circuit, or
  the second end of the wavelength wire is connected to the first end of the at least one second capacitor and the ungrounded side of the first capacitor, and the second end of the at least one second capacitor is connected to the ungrounded side of the first capacitor and the element provided in the tuning and matching circuit,
the tuning and matching circuit is set to tune and match into a frequency of the signals if the switch part is changed over between the grounded connection and the ungrounded connection,
if the tuning and matching circuit is set to tune and match into the frequency of the signals when the switch part is changed over to the grounded connection, the switch part is changed over to the grounded connection in use and to the ungrounded connection in nonuse, and
if the tuning and matching circuit is set to tune and match into the frequency of the signals when the switch part is changed over to the ungrounded connection, the switch part is changed over to the ungrounded connection in use and to the grounded connection in nonuse.

12. A signal transmitting and receiving circuit according to claim 11, wherein the switch part is a circuit including one or more diodes.

13. A signal transmitting and receiving circuit according to claim 11, wherein:
the tuning and matching circuit is arranged in a magnetic field, and
the length L of the wavelength wire is arranged in an area of magnetic field intensity in which an operation of the switch part is guaranteed.

14. A signal transmitting and receiving circuit according to claim 11, wherein the length L of the wavelength wire is arranged in an area of temperatures in which an operation of the switch part is guaranteed, when the tuning and matching circuit is cooled down.

15. A signal transmitting and receiving circuit according to claim 11, wherein each of the signals is an electromagnetic wave signal having a frequency of 10 MHz or more.

16. A signal transmitting and receiving equipment comprising a transmitting equipment and a receiving equipment, wherein at least one of the transmitting equipment or the receiving equipment includes the signal transmitting and receiving circuit according to claim 11.

17. A NMR probe for transmitting and receiving nuclear magnetic resonance signals, the NMR probe comprising a transmitting equipment and a receiving equipment, wherein at least one of the transmitting equipment or the receiving equipment includes the signal transmitting and receiving circuit according to claim 11.

18. A nuclear magnetic resonance equipment comprising:
a transmitting equipment for irradiating signals for exciting nuclear magnetic resonance signals in a sample,
a receiving equipment for receiving the nuclear magnetic resonance signals, and
a magnet for generating a static magnetic field in the sample,
wherein at least one of the transmitting equipment or the receiving equipment includes the signal transmitting and receiving circuit according to claim 11.

19. A nuclear magnetic resonance equipment comprising:
a transmitting equipment for irradiating signals for exciting nuclear magnetic resonance signals in a sample,
a receiving equipment for receiving the nuclear magnetic resonance signals, and
a magnet for generating a static magnetic field in the sample, wherein:
the magnet is arranged such that a direction of the static magnetic field is a vertical direction or a horizontal direction,
a bore of the magnet is arranged parallel or orthogonal to the direction of the static magnetic field, and
at least one of the transmitting equipment or the receiving equipment includes the signal transmitting and receiving circuit according to claim 11.

* * * * *